(12) United States Patent
Cornfeld et al.

(10) Patent No.: US 8,778,199 B2
(45) Date of Patent: Jul. 15, 2014

(54) EPITAXIAL LIFT OFF IN INVERTED METAMORPHIC MULTIJUNCTION SOLAR CELLS

(75) Inventors: Arthur Cornfeld, Sandia Park, NM (US); Daniel McGlynn, Albuquerque, NM (US); Tansen Varghese, Regensburg (DE)

(73) Assignee: Emoore Solar Power, Inc., Albuquerque, NM (US)

( * ) Notice: Subject to any disclaimer, the term of this patent is extended or adjusted under 35 U.S.C. 154(b) by 143 days.

(21) Appl. No.: 13/465,477

(22) Filed: May 7, 2012

(65) Prior Publication Data
US 2012/0276676 A1 Nov. 1, 2012

Related U.S. Application Data

(63) Continuation-in-part of application No. 12/367,991, filed on Feb. 9, 2009, now abandoned.

(51) Int. Cl.
*B29D 11/00* (2006.01)
*H01L 31/0735* (2012.01)
*H01L 31/0725* (2012.01)
*H01L 31/18* (2006.01)
*H01L 31/0687* (2012.01)

(52) U.S. Cl.
CPC ........ *H01L 31/1844* (2013.01); *H01L 31/0735* (2013.01); *Y02E 10/544* (2013.01); *H01L 31/0725* (2013.01); *H01L 31/06875* (2013.01)
USPC ................. 216/24; 216/36; 216/40; 438/694; 438/455

(58) Field of Classification Search
USPC .................. 106/287.12; 117/84, 97; 136/249; 156/230, 236; 216/36, 40, 81; 228/208; 257/13, 184, 190, 197, 280, 315, 347, 257/352, 415, 458, 459, 507, 59, 618, 723, 257/79, 82, 88; 264/264, 319, 334, 40.1, 264/496; 345/107, 173, 204, 8; 349/163, 349/25, 42, 45; 355/75; 359/291, 296; 369/126; 372/11; 427/387; 430/22, 430/321; 435/455; 438/106, 107, 118, 120, 438/149, 164, 197, 22, 26, 27, 28, 29, 30, 438/34, 416, 455, 458, 46, 475, 479, 500, 438/507, 59, 691, 780, 795; 445/24; 522/1; 700/120; 73/865.9
See application file for complete search history.

(56) References Cited

U.S. PATENT DOCUMENTS 3,488,834 A 1/1970 Baird
3,964,155 A 6/1976 Leinkram et al.
(Continued)

FOREIGN PATENT DOCUMENTS

EP 1 109 230 A2 6/2001
EP 1 863 099 A2 12/2007
(Continued)

OTHER PUBLICATIONS

Wanlass et al. Lattice-Mismatched Approaches for High-Performance, III-V Photovoltaic Energy Converters, IEEE, 2005 p. 530-535.*

(Continued)

*Primary Examiner* — Duy Deo
*Assistant Examiner* — Erin Bergner

(57) ABSTRACT

The present disclosure provides a process for manufacturing a solar cell by selectively freeing an epitaxial layer from a single crystal substrate upon which it was grown. In some embodiments the process includes, among other things, providing a first substrate; depositing a separation layer on said first substrate; depositing on said separation layer a sequence of layers of semiconductor material forming a solar cell; mounting and bonding a flexible support on top of the sequence of layers; etching said separation layer while applying an agitating action to the etchant solution so as to remove said flexible support with said epitaxial layer from said first substrate.

20 Claims, 34 Drawing Sheets

(56) References Cited

U.S. PATENT DOCUMENTS

| | | | |
|---|---|---|---|
| 4,001,864 A | 1/1977 | Gibbons | |
| 4,255,211 A | 3/1981 | Fraas | |
| 4,338,480 A | 7/1982 | Antypas et al. | |
| 4,393,576 A | 7/1983 | Dahlberg | |
| 4,612,408 A | 9/1986 | Moddel et al. | |
| 4,727,047 A | 2/1988 | Bozler et al. | |
| 4,843,037 A | 6/1989 | Yablonovitch et al. | |
| 4,846,931 A | 7/1989 | Gmitter et al. | |
| 4,881,979 A | 11/1989 | Lewis | |
| 4,883,561 A * | 11/1989 | Gmitter et al. | 438/27 |
| 4,909,863 A * | 3/1990 | Birkmire et al. | 148/33.4 |
| 5,019,177 A | 5/1991 | Wanlass | |
| 5,021,360 A | 6/1991 | Melman et al. | |
| 5,053,083 A | 10/1991 | Sinton | |
| 5,217,539 A | 6/1993 | Fraas et al. | |
| 5,322,572 A | 6/1994 | Wanlass | |
| 5,342,453 A | 8/1994 | Olson | |
| 5,376,185 A | 12/1994 | Wanlass | |
| 5,465,009 A * | 11/1995 | Drabik et al. | 257/723 |
| 5,479,032 A | 12/1995 | Forrest et al. | |
| 5,510,272 A | 4/1996 | Morikawa et al. | |
| 5,683,928 A | 11/1997 | Wojnarowski et al. | |
| 5,944,913 A | 8/1999 | Hou et al. | |
| 6,155,909 A | 12/2000 | Henley et al. | |
| 6,165,873 A | 12/2000 | Hamada | |
| 6,180,432 B1 | 1/2001 | Freeouf | |
| 6,239,354 B1 | 5/2001 | Wanlass | |
| 6,252,287 B1 | 6/2001 | Kurtz et al. | |
| 6,255,731 B1 * | 7/2001 | Ohmi et al. | 257/758 |
| 6,281,426 B1 | 8/2001 | Olson et al. | |
| 6,291,313 B1 * | 9/2001 | Henley et al. | 438/458 |
| 6,300,557 B1 | 10/2001 | Wanlass | |
| 6,300,558 B1 | 10/2001 | Takamoto et al. | |
| 6,340,788 B1 * | 1/2002 | King et al. | 136/261 |
| 6,482,672 B1 | 11/2002 | Hoffman et al. | |
| 6,486,541 B2 | 11/2002 | Usami et al. | |
| 6,573,129 B2 | 6/2003 | Hoke et al. | |
| 6,631,150 B1 | 10/2003 | Najda | |
| 6,660,928 B1 | 12/2003 | Patton et al. | |
| 6,690,041 B2 | 2/2004 | Armstrong et al. | |
| 6,794,631 B2 | 9/2004 | Clark | |
| 6,815,736 B2 | 11/2004 | Mascarenhas | |
| 6,946,309 B2 | 9/2005 | Camras et al. | |
| 6,951,819 B2 | 10/2005 | Iles et al. | |
| 6,974,521 B2 | 12/2005 | Schermer | |
| 7,015,131 B2 | 3/2006 | Iwatsu et al. | |
| 7,060,591 B2 | 6/2006 | Yamazaki et al. | |
| 7,071,407 B2 | 7/2006 | Faterni et al. | |
| 7,122,734 B2 | 10/2006 | Fetzer et al. | |
| 7,166,520 B1 | 1/2007 | Henley | |
| 7,198,671 B2 | 4/2007 | Ueda | |
| 7,255,919 B2 | 8/2007 | Sakata et al. | |
| RE39,957 E | 12/2007 | Huang et al. | |
| 7,488,890 B2 | 2/2009 | Takamoto et al. | |
| 7,727,795 B2 | 6/2010 | Stan et al. | |
| 7,741,146 B2 | 6/2010 | Cornfeld et al. | |
| 7,785,989 B2 | 8/2010 | Sharps et al. | |
| 7,812,249 B2 | 10/2010 | King et al. | |
| 7,842,881 B2 | 11/2010 | Cornfeld et al. | |
| 7,846,759 B2 | 12/2010 | Atwater, Jr. et al. | |
| 7,932,123 B2 | 4/2011 | Rogers et al. | |
| 7,960,201 B2 | 6/2011 | Cornfeld et al. | |
| 7,994,419 B2 | 8/2011 | Pan et al. | |
| 8,003,492 B2 | 8/2011 | Gmitter et al. | |
| 8,039,291 B2 | 10/2011 | Cornfeld et al. | |
| 8,067,687 B2 | 11/2011 | Wanlass | |
| 8,187,907 B1 | 5/2012 | Newman | |
| 8,227,689 B2 | 7/2012 | King et al. | |
| 8,236,600 B2 | 8/2012 | Cornfeld | |
| 8,263,853 B2 | 9/2012 | Varghese | |
| 8,263,856 B2 | 9/2012 | Cornfeld et al. | |
| 8,378,281 B2 | 2/2013 | Kats et al. | |
| 2002/0020053 A1 * | 2/2002 | Fonash et al. | 29/623.1 |
| 2002/0106870 A1 | 8/2002 | Henley et al. | |
| 2003/0047289 A1 | 3/2003 | Jaussaud et al. | |
| 2003/0087503 A1 | 5/2003 | Sakaguchi et al. | |
| 2003/0203547 A1 | 10/2003 | Sakaguchi et al. | |
| 2004/0072383 A1 | 4/2004 | Nagahama et al. | |
| 2004/0166681 A1 | 8/2004 | Iles et al. | |
| 2005/0211291 A1 | 9/2005 | Bianchi | |
| 2006/0021565 A1 | 2/2006 | Zahler et al. | |
| 2006/0162768 A1 | 7/2006 | Wanlass et al. | |
| 2006/0185582 A1 | 8/2006 | Atwater, Jr. et al. | |
| 2007/0137694 A1 | 6/2007 | Foster et al. | |
| 2007/0218649 A1 | 9/2007 | Hernandez | |
| 2007/0277873 A1 * | 12/2007 | Cornfeld et al. | 136/255 |
| 2007/0277874 A1 | 12/2007 | Dawson-Elli et al. | |
| 2008/0029151 A1 | 2/2008 | McGlynn et al. | |
| 2008/0108171 A1 | 5/2008 | Rogers et al. | |
| 2008/0149173 A1 | 6/2008 | Sharps | |
| 2008/0185038 A1 | 8/2008 | Sharps | |
| 2008/0245409 A1 | 10/2008 | Varghese et al. | |
| 2009/0038678 A1 | 2/2009 | Pan et al. | |
| 2009/0038679 A1 | 2/2009 | Varghese et al. | |
| 2009/0078308 A1 | 3/2009 | Varghese et al. | |
| 2009/0078309 A1 | 3/2009 | Cornfeld et al. | |
| 2009/0078310 A1 | 3/2009 | Stan et al. | |
| 2009/0078311 A1 | 3/2009 | Stan et al. | |
| 2009/0155952 A1 | 6/2009 | Stan et al. | |
| 2009/0180732 A1 | 7/2009 | Takai et al. | |
| 2009/0188546 A1 | 7/2009 | McGlynn et al. | |
| 2009/0223554 A1 | 9/2009 | Sharps | |
| 2009/0229658 A1 | 9/2009 | Stan et al. | |
| 2009/0229662 A1 | 9/2009 | Stan et al. | |
| 2009/0272430 A1 | 11/2009 | Cornfeld et al. | |
| 2009/0272438 A1 | 11/2009 | Cornfeld | |
| 2009/0277488 A1 | 11/2009 | Greiff et al. | |
| 2009/0288703 A1 | 11/2009 | Stan et al. | |
| 2009/0314348 A1 | 12/2009 | McGlynn et al. | |
| 2010/0012174 A1 | 1/2010 | Varghese et al. | |
| 2010/0012175 A1 | 1/2010 | Varghese et al. | |
| 2010/0047959 A1 | 2/2010 | Cornfeld et al. | |
| 2010/0093127 A1 | 4/2010 | Sharps et al. | |
| 2010/0122724 A1 | 5/2010 | Cornfeld et al. | |
| 2010/0122764 A1 | 5/2010 | Newman | |
| 2010/0147366 A1 | 6/2010 | Stan et al. | |
| 2010/0186804 A1 | 7/2010 | Cornfeld | |
| 2010/0203730 A1 | 8/2010 | Cornfeld et al. | |
| 2010/0206365 A1 | 8/2010 | Chumney et al. | |
| 2010/0229913 A1 | 9/2010 | Cornfeld | |
| 2010/0229926 A1 | 9/2010 | Newman et al. | |
| 2010/0229932 A1 | 9/2010 | Cornfeld et al. | |
| 2010/0229933 A1 | 9/2010 | Cornfeld | |
| 2010/0233838 A1 | 9/2010 | Varghese | |
| 2010/0236615 A1 | 9/2010 | Sharps | |
| 2010/0282288 A1 | 11/2010 | Cornfeld | |
| 2011/0041898 A1 | 2/2011 | Cornfeld | |
| 2011/0171813 A1 | 7/2011 | Rogers et al. | |
| 2011/0316120 A1 | 12/2011 | Rogers et al. | |
| 2012/0211047 A1 | 8/2012 | Cornfeld | |
| 2012/0211068 A1 | 8/2012 | Cornfeld et al. | |

FOREIGN PATENT DOCUMENTS

| | | |
|---|---|---|
| EP | 0 658 944 B1 | 4/2009 |
| FR | 2 878 076 A1 | 5/2006 |
| WO | WO 2005/015638 A1 | 2/2005 |

OTHER PUBLICATIONS

U.S. Appl. No. 12/265,113, filed Nov. 5, 2008, Varghese.

U.S. Appl. No. 12/708,361, filed Feb. 18, 2010, Cornfeld.

Advisory Action mailed Mar. 15, 2011. U.S. Appl. No. 11/445,793; 46 pgs.

Aiken et al. "Consideration of High Bandgap Subcells for Advanced Multijunction Solar Cells," Conference Record of the 2006 IEEE 4$^{th}$ World Conference on Photovoltaic Energy Conversion. May 1, 2006, pp. 838-841.

Bett et al., "Multijunction Concentrator Solar Cells," *Concentrator Photovoltaics*, Berlin, Germany 2007, Ch. 4, vol. 130.

Cornfeld et al., "Development of a Large Area Inverted Metamorphic Multi-junction (IMM) Highly Efficient AM0 Solar Cell," 33$^{rd}$ IEEE Photovoltaic Specialists Conference, May 11-16, 2008, San Diego, CA; 5 pgs.

(56) References Cited

OTHER PUBLICATIONS

Cornfeld et al., "Development of a Large Area Inverted Metamorphic Multi-junction Highly Efficient AM0 Solar Cell," Conference paper presented at the 33$^{rd}$ IEEE Photovoltaic Specialists Conference (May 11-16, 2008) on May 12, 2008. San Diego, CA; 17 pages.
U.S. Appl. No. 12/716,814, filed Mar. 3, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/813,408, filed Jun. 10, 2010, Patel.
U.S. Appl. No. 12/844,673, filed Jul. 27, 2010, Stan.
Cornfeld et al., "Advances in the Performance of Inverted Metamorphic Multi-junction Solar Cells," 23$^{rd}$ European Photovoltaic Energy Conference, Sep. 1-5, 2008, Valencia, Spain; 11 pgs.
European Search Report for Application No. EP 08 01 3466. Dec. 18, 2009. European Patent Office, Berlin, Germany; 4 pgs.
Fontcuberta i Morral al., "InGaAs/InP Double HeteroStructures on InP/Si Templates Fabricated by Wafer Bonding and Hydrogen-Induced Exfoliation," *Applied Physics Letters*, Dec. 29, 2003; 83(26):5413-5415.
Friedman et al., "0.7-eV GaInAs Junction for a GaInP/GaAs/GaInAs(1eV)/GaInAs(0.7eV) Four-Junction Solar Cell," 2006 IEEE 4$^{th}$ World Conference on Photovoltaic Energy Conversion, May 7-12, 2006; 598-602. Waikoloa, HI, USA.
Geisz et al., "High-efficiency GaInP/GaAs/InGaAs triple junction solar cells grown inverted with a metamorphic bottom junction," *Applied Physics Letters*, 2007; 91 (023502):023502-1-023502-3. Online publication Jul. 10, 2007. American Institute of Physics, Melville, NY.
Geisz et al., "Inverted GaInP / (In)GaAs / InGaAs Triple-Junction Solar Cells with Low-Stress Metamorphic Bottom Junctions," 33$^{rd}$ IEEE Photovoltaic Specialists Conference, May 11-16, 2008, San Diego, CA USA; 5 pgs.
Koh et al., "Fabrication of Superconducting Delay Line with GaAs Schottky Diode," *IEEE Transactions on Applied Superconductivity*, Jun. 1999; 9(2):3224-3227.
King et al., "Next-Generation, High-Efficiency III-V Multijunction Solar Cells," 28$^{th}$ IEEE Photovoltaic Specialists Conference, Sep. 15-22, 2000, Anchorage, AK, USA.
King et al., "High-Efficiency Space and Terrestrial Multijunction Solar Cells Through Bandgap Control in Cell Structures," 2002 Photovoltaic Specialists Conference, Conference Record of the 29$^{th}$ IEEE, May 19-24, 2002, New Orleans, LA, USA, pp. 776-781.
Law et al., "Future technology pathways of terrestrial III-V multijunction solar cells for concentrator photovoltaic systems," *Solar Energy Materials & Solar Cells*, 2010; 94:1314-1318. Elsevier, Amsterdam, Netherlands.
Office Action mailed Jan. 4, 2011. U.S. Appl. No. 11/445,793. (Sexl reference, double patenting rejection).
Partial European Search Report for Application No. EP 08 01 3466; Feb. 12, 2009. European Patent Office, Berlin, Germany.
Schermer et al., "High Rate Epitaxial Lift-Off of InGaP Films from GaAs Substrates," *Applied Physics Letters*, Apr. 10, 2000; 76(15):2131-2133. American Institute of Physics, Melville, NY.
Schermer et al., "Epitaxial Lift-Off for large area thin film III/V devices," *Phys. Stat. Sol.* (a) Feb. 10, 2005; 202(4):501-508. Wiley-VCH, Weinheim, Germany.
Schermer et al., "Photon Confinement in High-Efficiency, Thin-Film III-V Solar Cells Obtained by Epitaxial lift-Off," *Thin Solid Films*, Jan. 19, 2006; 511-512:645-653. Elsevier, Amsterdam, Netherlands.
Schultz et al. "High Efficiency 1.0 eV GaInAs Bottom Solar Cell for 3-junction Monolithic Stack," Conference Record of the Twenty First IEEE Photovoltaic Specialists Conference, May 21-25, 1990 Kissimmee, Florida. New York: The Institute of Electrical and Electronics Engineers, Inc.; pp. 148-152.
Sexl et al., "MBE Growth of Metamorphic In(Ga)AIAs Buffers," 1997 IEEE International Symposium on Compound Semiconductors. Sep. 1997, pp. 49-52. IEEE, Piscataway, NJ.

Sharps et al., "Inverting the triple junction improves efficiency and flexibility," *Compound Semiconductor*, Oct. 2007; 13(9):25-28. IOP Publishing, Ltd., Bristol, England.
Sinharoy et al., "Progress in the Development of Metamorphic Multi-junction III-V Space Solar Cells," *Progress in Photovoltaics: Research and Applications*, Feb. 2002; 10:427-432. John Wiley & Sons, Ltd. Hoboken, NJ.
Stan et al., "Recent Advances in the Performance of Multi-Junction Space Solar Cells," 22nd European Photovoltaic Solar Energy Conference, Sep. 3-7, 2007, Milan, Italy; pp. 101-105.
Stan et al., "Very High Efficiency Triple Junction Solar Cells by MOVPE," 14$^{th}$ International Conference of Metalorganic Vapor Phase Epitaxy. Jun. 1-6, 2008, Metz, France; 32 pgs.
Stan et al., "High-efficiency quadruple junction solar cells using OMVPE with inverted metamorphic device structures," *Journal of Crystal Growth*, 2010; 312: 1370-1374. Elsevier, Amsterdam, Netherlands.
Sze et al., *Physics of Semiconductor Devices*, Hoboken, NJ. 3$^{rd}$ ed., 2007. p. 57 (Figure 32). John Wiley & Sons, Inc.
Takamoto et al., "Future Development of InGaP/(In)GaAs Based Multijunction Solar Cells," Proceedings of the 31$^{st}$ IEEE PVSC, Jan. 3-7, 2005, pp. 519-524. Lake Buena Vista, FL.
Takamoto et al., "InGaP/GaAs-based Multijunction Solar Cells," *Progress in Photovoltaics: Research and Applications*, 2005; 13: 495-511.
Takamoto et al., "Paper-Thin InGaP/GaAs Solar Cells," 2006 IEEE 4$^{th}$ World Conference on Photovoltaic Energy Conversion, May 7-12, 2006, Waikoloa, HI. pp. 1769-1772.
Tatavarti et al., "Lightweight, Low Cost GaAs Solar Cells on 4" Epitaxial Liftoff (ELO) Wafers," 33$^{rd}$ IEEE Photovoltaic Specialists Conference, May 11-16, 2008, San Diego, CA; 4 pages.
Van Geelen et al., "Epitaxial Lift-Off GaAs Solar Cell from a Reusable GaAs Substrate," *Materials Science and Engineering*, 1997; B45:162-171. Elsevier, Amsterdam, Netherlands.
Venkatasubramanian et al., "An Inverted-Growth Approach to Development of an IR-Transparent, High-Efficiency AIGaAs/GaAs Cascade Solar Cell," 22$^{nd}$ IEEE Photovoltaic Specialists Conference, Oct. 7-11, 1991, Las Vegas, NV;pp. 93-98.
Venkatasubramanian et al., "High-quality eutectic-metal-bonded AIGaAs-GaAs thin films on Si Substrates," *Applied Physics Letters*, Feb. 17, 1992; 60(7):886-888.
Voncken et al., "Strain-accelerated HF etching of AIAs for epitaxial lift-off," *Institute of Physics Publishing*, 2004;16:3585-3596.
Wanlass et al., "Lattice-Mismatched Approaches for High-Performance, III-V Photovoltaic Energy Converters," Proceedings of the 31$^{st}$ IEEE PVSC, Jan. 3-7, 2005, Lake Buena Vista, FL.
Wanlass et al., "Monolithic, Ultra-Thin GaInP/GaAs/GaInAs Tandem Solar Cells," 2006 4$^{th}$ IEEE World Conference on Photovoltaic Energy Conversion, May 1, 2006, pp. 729-732.
Wanlass et al., "Monolithic, Ultra-Thin GaInP/GaAs/GaInAs Tandem Solar Cells," 2006 IEEE 4$^{th}$ World Conference on Photovoltaic Energy Conversion, May 7-12, 2006, Waikoloa, HI.
Wurfel, *Physics of Solar Cells: from Basic Principles to Advanced Concepts, 2$^{nd}$ Updated and Expanded Edition*, 2009. Sections 6.4, 6.5 and 6.8. 20 pages. Wiley-VCH, Weinheim, Germany.
Yablonovitch et al., "Extreme Selectivity in the Lift-off of Epitaxial GaAs Films," *Applied Physics Letters*, Dec. 28, 1987; 51(26):2222-2224. American Institute of Physics, Melville, NY.
Yablonovitch, "Ultra-Efficient Epitaxial Liftoff Solar Cells Exploiting Optical Confinement in the Wave Limit," Final Technical Report Jul. 19, 1994—Jul. 18, 1998; Nov. 1999, NREL/SR-520-26903. NREL, Golden, CO; 40 pgs.
Yamaguchi, "Physics and Technologies of Superhigh-Efficiency Tandem Solar Cells," *Semiconductors*, Sep. 1999; 33(9):961-964. Toyota Technological Institute, Nagoya, Japan. ©1999, American Institute of Physics.
Yoon et al., "Progress of Inverted Metamorphic III-V Solar Cell Development at Spectrolab," 33$^{rd}$ IEEE Photovoltaic Specialists Conference, May 11-16, 2008, San Diego, CA, USA; 6 pgs.

* cited by examiner

EPITAXIAL LIFT OFF IN INVERTED METAMORPHIC MULTIJUNCTION SOLAR CELLS

This application is a continuation-in-part of application Ser. No. 12/367,991, filed Feb. 9, 2009, which is incorporated herein by reference in its entirety.

REFERENCE TO RELATED APPLICATIONS

This application is related to co-pending U.S. patent application Ser. No. 13/440,331 filed Apr. 15, 2012.

This application is related to co-pending U.S. patent application Ser. No. 13/401,181 filed Feb. 21, 2012.

This application is related to co-pending U.S. patent application Ser. No. 12/844,673 filed Jul. 27, 2010.

This application is related to co-pending U.S. patent application Ser. No. 12/813,408 filed Jun. 10, 2010.

This application is related to co-pending U.S. patent application Ser. No. 12/775,946 filed May 7, 2010.

This application is related to co-pending U.S. patent application Ser. No. 12/756,926, filed Apr. 8, 2010.

This application is related to co-pending U.S. patent application Ser. No. 12/730,018, filed Mar. 23, 2010.

This application is related to co-pending U.S. patent application Ser. No. 12/716,814, filed Mar. 3, 2010.

This application is related to co-pending U.S. patent application Ser. No. 12/708,361, filed Feb. 18, 2010.

This application is related to co-pending U.S. patent application Ser. No. 12/637,241, filed Dec. 14, 2009.

This application is related to co-pending U.S. patent application Ser. No. 12/623,134, filed Nov. 20, 2009.

This application is related to co-pending U.S. patent application Ser. No. 12/544,001, filed Aug. 19, 2009.

This application is related to co-pending U.S. patent application Ser. Nos. 12/401,137, 12/401,157, and 12/401,189, filed Mar. 10, 2009.

This application is related to co-pending U.S. patent application Ser. No. 12/362,201, now U.S. Pat. No. 7,960,201; Ser. No. 12/362,213; and Ser. No. 12/362,225, filed Jan. 29, 2009.

This application is related to co-pending U.S. patent application Ser. No. 12/337,014 filed Dec. 17, 2008, now U.S. Pat. No. 7,785,989, and Ser. No. 12/337,043 filed Dec. 17, 2008.

This application is related to co-pending U.S. patent application Ser. No. 12/271,127 and Ser. No. 12/271,192 filed Nov. 14, 2008.

This application is related to co-pending U.S. patent application Ser. No. 12/267,812 filed Nov. 10, 2008.

This application is related to co-pending U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to co-pending U.S. patent application Ser. No. 12/187,477, filed Aug. 7, 2008.

This application is related to co-pending U.S. patent application Ser. No. 12/218,558 and U.S. patent application Ser. No. 12/218,582 filed Jul. 16, 2008.

This application is related to co-pending U.S. patent application Ser. No. 12/123,864 filed May 20, 2008.

This application is related to co-pending U.S. patent application Ser. No. 12/023,772, filed Jan. 31, 2008.

This application is related to U.S. patent application Ser. No. 11/956,069, filed Dec. 13, 2007, and its divisional application Ser. No. 12/187,454 filed Aug. 7, 2008, now U.S. Pat. No. 7,727,795.

This application is also related to co-pending U.S. patent application Ser. Nos. 11/860,142 and 11/860,183 filed Sep. 24, 2007.

This application is also related to co-pending U.S. patent application Ser. No. 11/445,793 filed Jun. 2, 2006.

This application is also related to co-pending U.S. patent application Ser. No. 11/500,053 filed Aug. 7, 2006, and its divisional application Ser. No. 12/417,367 filed Apr. 2, 2009.

GOVERNMENT RIGHTS STATEMENT

This invention was made with government support under Contract No. FA9453-06-C-0345 awarded by the U.S. Air Force. The Government has certain rights in the invention.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500 X), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, WEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

Prior to the inventions described in this and the related applications noted above, the materials and fabrication steps disclosed in the prior art have not been adequate to produce a commercially viable and energy efficient inverted metamorphic multijunction solar cell using commercially established fabrication processes.

SUMMARY OF THE INVENTION

Briefly, and in general terms, the present invention provides a method for manufacturing a solar cell using a process for selectively freeing an epitaxial layer from a single crystal substrate upon which it was grown comprising: providing a first substrate of gallium arsenide; depositing a separation layer on said first substrate; depositing on the separation layer a sequence of layers of semiconductor material forming a solar cell including: forming over the separation layer an upper first solar subcell having a first band gap and including a semiconductor contact layer; forming over said first solar subcell a middle second solar subcell having a second band gap smaller than said first band gap; forming a graded interlayer over said second solar subcell; and forming over said graded interlayer a lower third solar subcell having a fourth band gap smaller than said second band gap such that said third subcell is lattice mismatched with respect to said second subcell; mounting the first substrate and the sequence of layers of semiconductor material on a flexible film; mechanically holding said first substrate against a bottom support of an etching apparatus; attaching a connecting link element that connects at least two opposed points on the periphery of the flexible film to an upper portion of the etching apparatus; introducing said solar cell having said flexible film bonded thereon into an etchant environment in said etching apparatus; etching said separation layer while applying mechanical tension to said connecting link element so as to remove said flexible film with the epitaxial layer from said first substrate; attaching the flexible film to a surrogate substrate by an electrostatic technique; depositing a contact metal layer over the semiconductor contact layer; lithographically processing the contact metal layer to form grid lines; attaching a cover glass over the grid lines; and removing the surrogate substrate.

In another aspect the present invention provides a process for manufacturing a solar cell by selectively freeing an epitaxial layer from a single crystal substrate upon which it was grown, comprising: providing a first substrate; depositing a separation layer on said first substrate; depositing on said separation layer a sequence of layers of semiconductor material forming a solar cell; mounting and bonding a flexible support on top of the sequence of layers; etching said separation layer while applying an agitating action to the etchant solution so as to remove said flexible support with said epitaxial layer from said first substrate; attaching the flexible support to a rigid surrogate substrate; depositing a metal layer over the semiconductor contact layer; and removing the flexible support and said rigid surrogate substrate.

Some implementations of the present invention may incorporate or implement fewer of the aspects and features noted in the foregoing summaries.

Additional aspects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWING

The invention will be better and more fully appreciated by reference to the following detailed description when considered in conjunction with the accompanying drawings, wherein.

DESCRIPTION OF THE PREFERRED EMBODIMENTS

Figure 1:
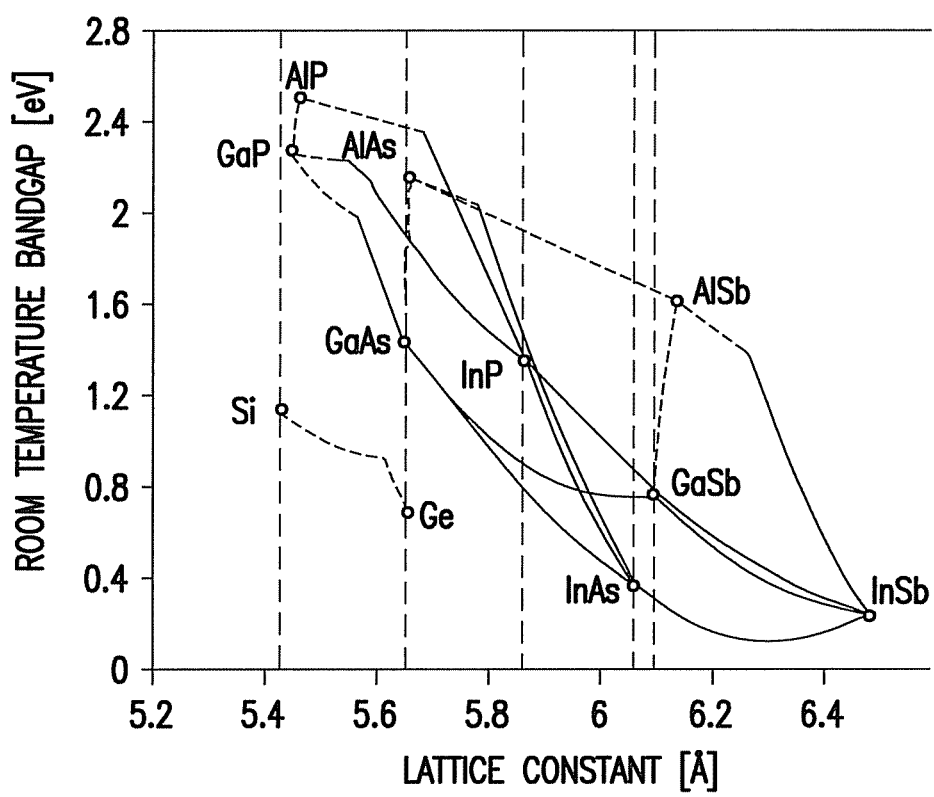
FIG. 1 is a graph representing the band gap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are initially grown epitaxially directly on a semiconductor growth substrate, such as for example GaAs or Ge, and such subcells are consequently lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e., a band gap in the range of 0.7 to 1.2 eV). A surrogate substrate or support structure is then attached or provided over the "bottom" or substantially lattice-mismatched lower subcell, and the growth semiconductor substrate is subsequently removed. (The growth substrate may then subsequently be re-used for the growth of a second and subsequent solar cells).

A variety of different features and aspects of inverted metamorphic multijunction solar cells are disclosed in the related applications noted above. Some or all of such features may be included in the structures and processes associated with the solar cells of the present invention. More particularly, one aspect of the present application is directed to the method of depositing a separation layer over the growth substrate, depositing the epitaxial layers forming a solar cell over the separation layer, and etching away the separation layer to release the epitaxial thin film solar cell layers. None, some or all of such aspects may be included in the structures and processes associated with the solar cells of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It should be apparent to one skilled in the art that the inclusion of additional semiconductor layers within the cell with similar or additional functions and properties is also within the scope of the present invention.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thug, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
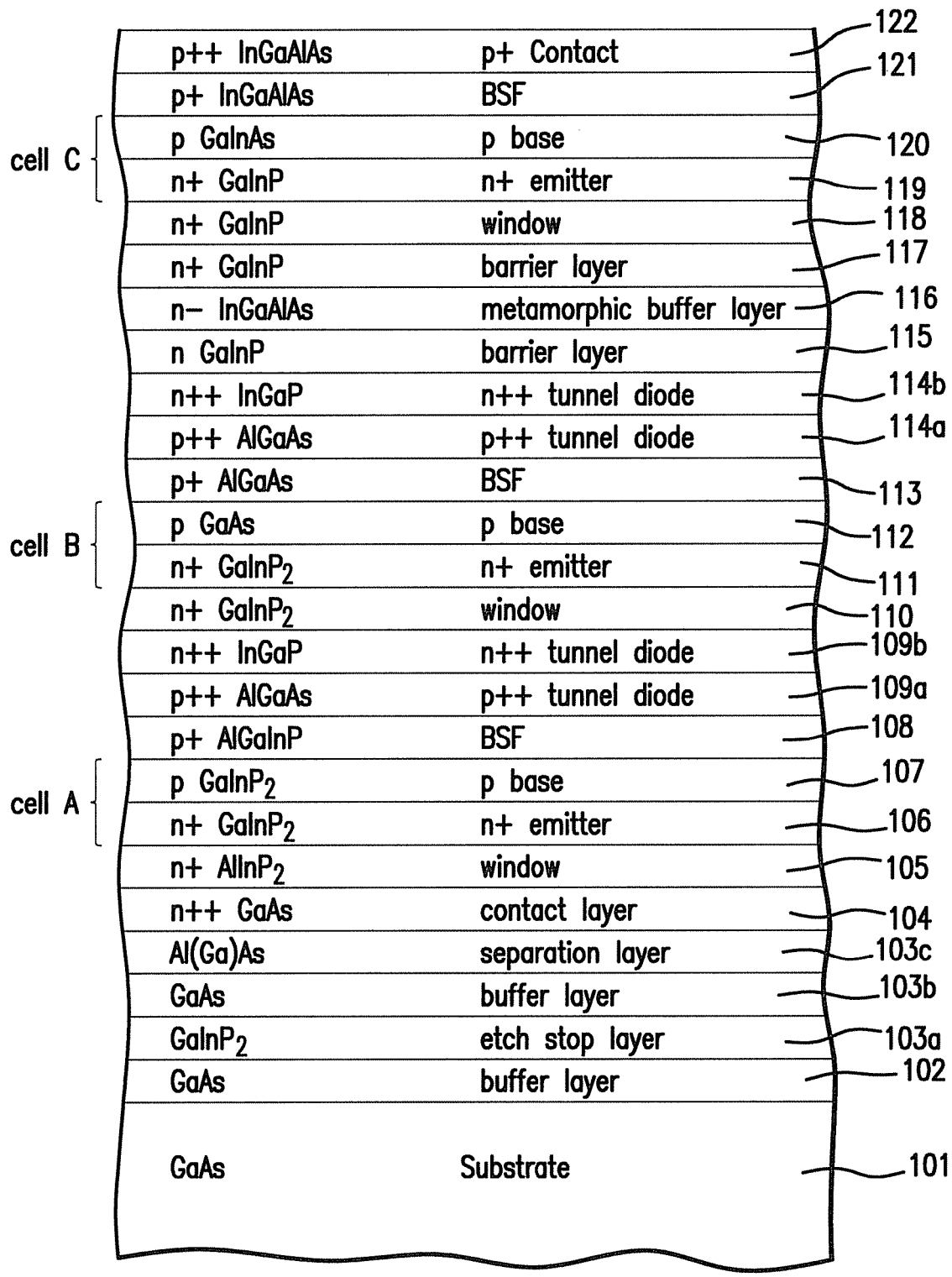
FIG. 2 is a cross-sectional view of the solar cell of the invention after the deposition of semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15.degree. off-cut substrate, that is to say, its surface is orientated 15.degree. off the (100) plane towards the (111)A plane, as more fully described in U.S. patent application Pub. No. 2009/0229662 A1 (Stan et al.). Other alternative growth substrates, such as described in U.S. Pat. No. 7,785,989 B2 (Sharps et al.), may be used as well.

In the case of a Ge substrate, a nucleation layer (not shown) is deposited directly on the substrate 101. On the substrate, or over the nucleation layer (in the case of a Ge substrate), a buffer layer 102 and an etch stop layer 103a are further deposited. In the case of GaAs substrate, the buffer layer 102 is preferably GaAs. In the case of Ge substrate, the buffer layer 102 is preferably InGaAs. On top of the etch stop layer, a buffer layer 103b of GaAs is deposited. On top of the buffer layer 103b, a thin separation layer 103c of Al(Ga) is deposited. The layer 103c is typically about 50 Angstroms in thickness. A contact layer 104 of GaAs is then deposited on layer 103c, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 20.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. patent application Pub. No. 2009/0272430 A1 (Cornfeld et al.). More generally, the window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 20.

In previously disclosed implementations of an inverted metamorphic solar cell, the middle cell was a homostructure. In the present invention, similarly to the structure disclosed in U.S. patent application Pub. No. 2009/0078310 A1 (Stan et al.), the middle subcell becomes a heterostructure with an InGaP emitter and its window is converted from InAlP to InGaP. This modification eliminated the refractive index discontinuity at the window/emitter interface of the middle subcell. Moreover, the window layer 110 is preferably doped three times that of the emitter 111 to move the Fermi level up closer to the conduction band and therefore create band bending at the window/emitter interface which results in constraining the minority carriers to the emitter layer.

In the preferred embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps then the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

A barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells A and B, or in the direction of growth into the bottom subcell C, and is more particularly described in copending U.S. patent application Pub. No. 2009/0078309 A1 (Cornfeld et al.).

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The band gap of layer 116 is constant throughout its thickness, preferably approximately equal to 1.5 eV, or otherwise consistent with a value slightly greater than the base band gap of the middle subcell B. The preferred embodiment of the graded interlayer may also be expressed as being composed of $(In_xGa_{1-x})_yAl_{1-y}As$, with x and y selected such that the band gap of the interlayer remains constant at approximately 1.50 eV or other appropriate band gap.

In the surfactant assisted growth of the metamorphic layer 116, a suitable chemical element is introduced into the reactor during the growth of layer 116 to improve the surface characteristics of the layer. In the preferred embodiment, such element may be a dopant or donor atom such as selenium (Se) or tellurium (Te). Small amounts of Se or Te are therefore incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic surfactants one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different band gap. In the preferred embodiment of the present invention, the layer 116 is composed of a plurality of layers of InGaAlAs, with monotonically changing lattice constant, each layer having the same band gap, approximately 1.5 eV.

The advantage of utilizing a constant band gap material such as InGaAlAs is that arsenide-based semiconductor material is much easier to process in standard commercial MOCVD reactors, while the small amount of aluminum assures radiation transparency of the metamorphic layers.

Although the preferred embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present invention, an optional second bather layer 117 may be deposited over the InGaAlAs metamorphic layer 116. The second bather layer 117 will typically have a different composition than that of bather layer 115, and performs essentially the same function of preventing threading dislocations from propagating. In the preferred embodiment, bather layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and p type InGaAs respectively, or n+ type InGaP and p type InGaAs for a heterojunction subcell, although another suitable materials consistent with lattice constant and band gap requirements may be used as well. The doping profile of layers 119 and 120 will be discussed in connection with FIG. 20.

A BSF layer 121, preferably composed of InGaAlAs, is then deposited on top of the cell C, the BSF layer performing the same function as the BSF layers 108 and 113.

Finally a high band gap contact layer 122, preferably composed of InGaAlAs, is deposited on the BSF layer 121.

This contact layer added to the bottom (non-illuminated) side of a lower band gap photovoltaic cell, in a single or a multijunction photovoltaic cell, can be formulated to reduce absorption of the light that passes through the cell, so that (1) an ohmic metal contact layer below (non-illuminated side) it will also act as a mirror layer, and (2) the contact layer doesn't have to be selectively etched off, to prevent absorption.

It should be apparent to one skilled in the art that additional layer(s) may be added or deleted in the cell structure without departing from the scope of the present invention.

Figure 3:
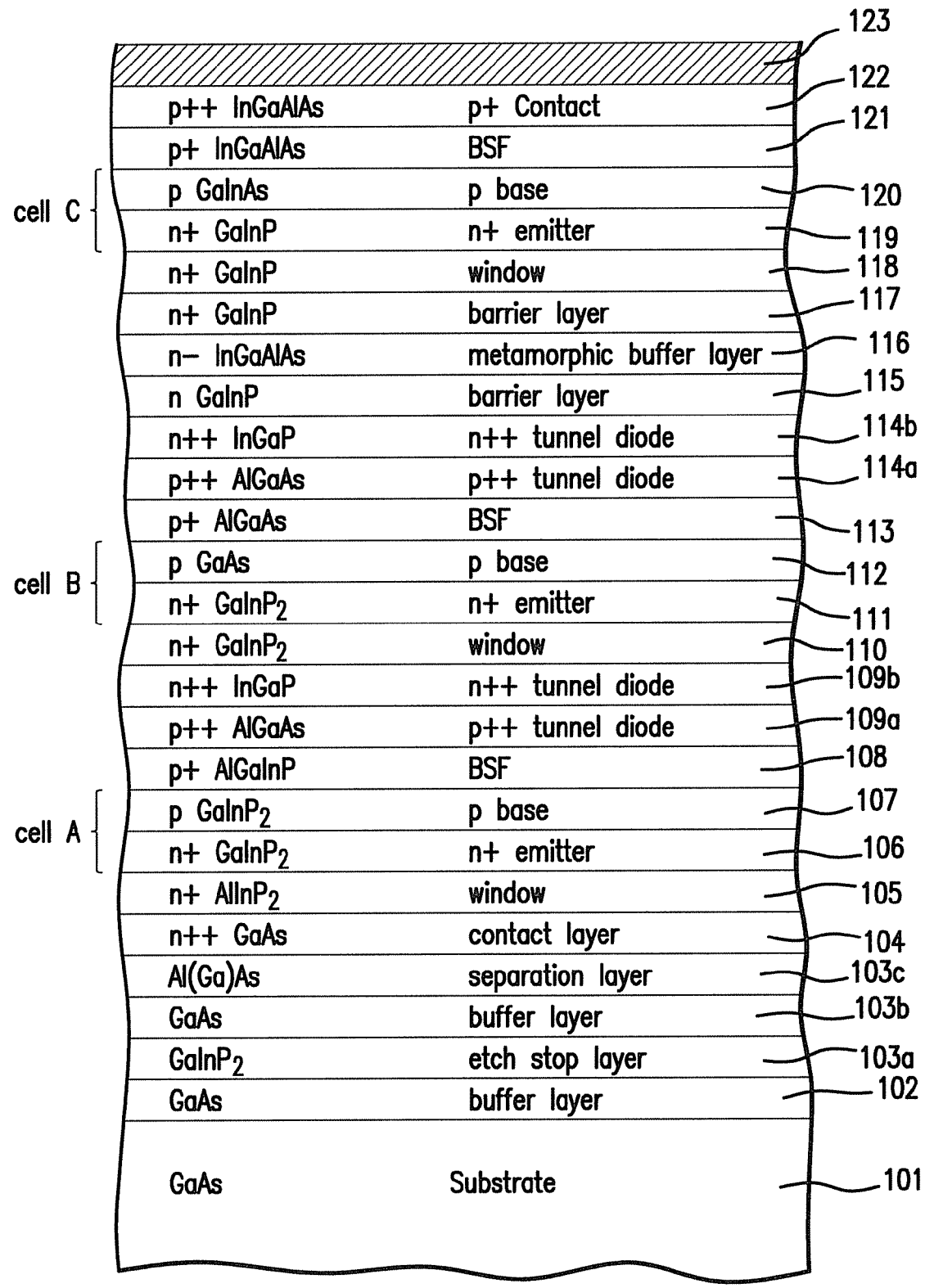
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+semiconductor contact layer 122. The metal is preferably the sequence of metal layers Ti/Au/Ag/Au or Ti/Pd/Ag, although other suitable sequences and materials may be used as well.

Also, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

Figure 4:
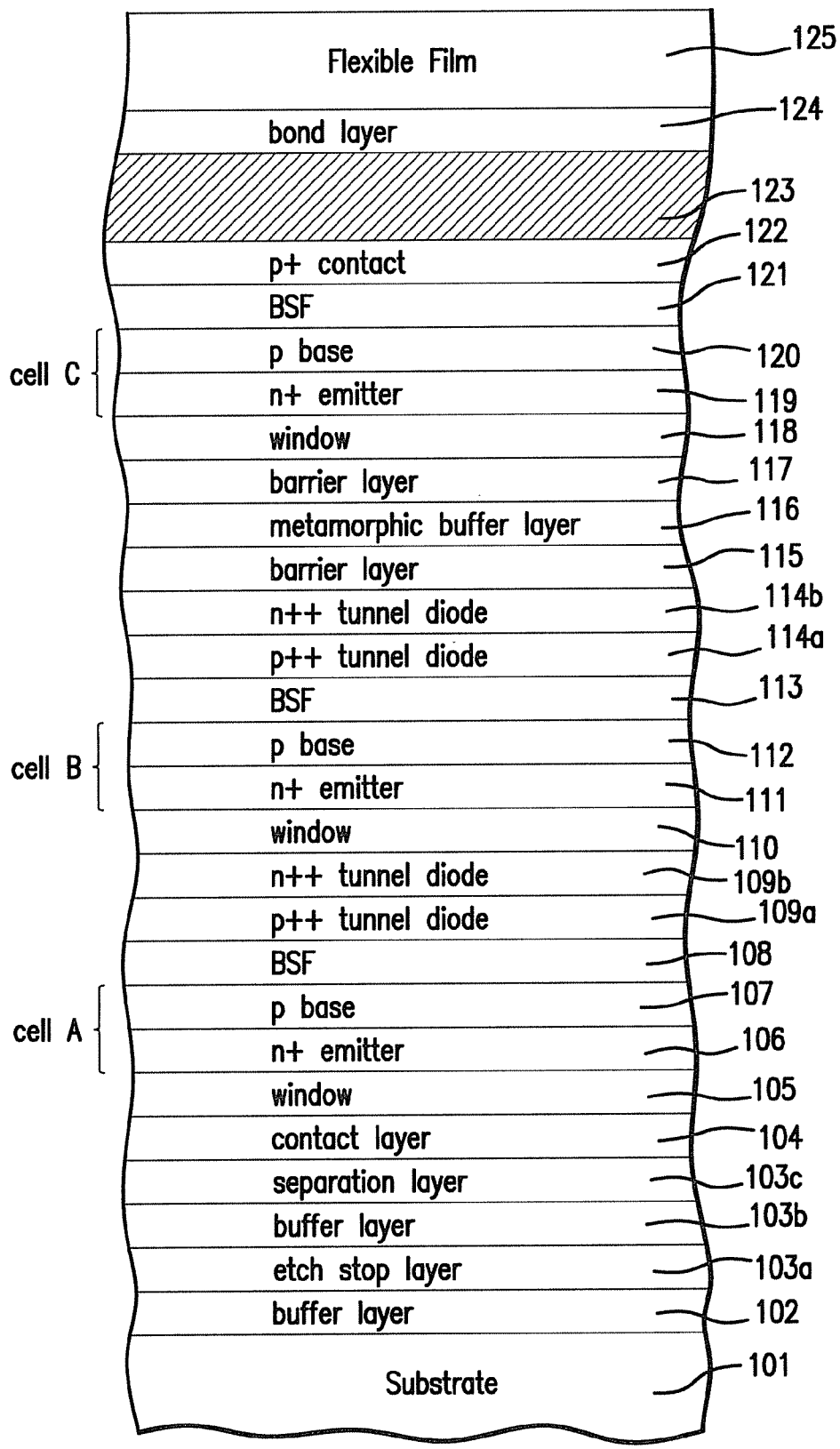
FIG. 4 is a cross-sectional view of the solar cell of FIG. 3 after the next process step in which a flexible film is attached.

FIG. 4 is a cross-sectional view of the solar cell of FIG. 3 after the next process step in which a bonding layer 124 is deposited over the metal layer 123 and a flexible film 125 attached over layer 124. In one embodiment, the flexible film 125 is a polyimide film such as Kapton (manufactured by DuPont.). In one embodiment of the present invention, the bonding layer is an adhesive, preferably Wafer Bond (manufactured by Brewer Science, Inc. of Rolla, Mo.). In other embodiments of the present invention, a solder or eutectic bonding layer 124, such as described in U.S. patent application Pub. No. 2010/0122764 A1 (Newman), or a bonding layer 124 such as described in U.S. patent application Ser. No. 12/265,113 filed Nov. 5, 2008, may be used, where the flexible film remains a permanent supporting component of the finished solar cell.

Figure 5:
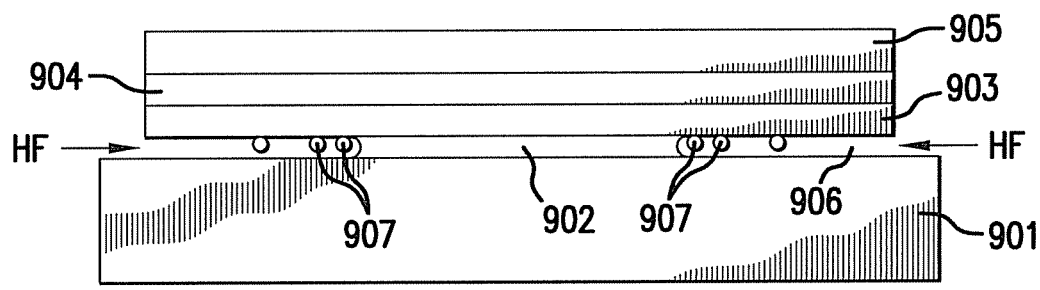
FIG. 5 is a cross-sectional view of a first method of epitaxial lift off known in the prior art.

FIG. 5 is a side elevational view showing an epitaxially grown thin film semiconductor device being peeled from an underlying single crystal substrate by a prior art etching technique described in U.S. Pat. No. 4,846,931 (Gmitter et al.). The Figure shows a single crystal GaAs substrate 901 having a thin release film 902 on the surface thereof and epitaxially grown p-type and n-type GaAs layers 903 and 904, forming a p-n junction device, thereon. A support layer 905 (described as a black wax in the prior art), overlies the epitaxial layers 903 and 904. Here, as hydrofluoric (HF) acid etches the release film 902 a uniformly thick channel 906 forms between the epi-layer 902 and the substrate 901. As etching progresses, the gas reaction product, which has the lowest solubility of any of the reactants or reaction products, is difficult to diffuse away thereby limiting the undercutting speed and the permissible HF acid concentration. If the solubility limits are exceeded, bubbles 907 form at the reaction zone in the channel 906 displacing the etchant and producing a gas pressure which cracks the epitaxial film. Hence, permissible acid concentrations and therefore etch speeds are very low.

Figure 6:
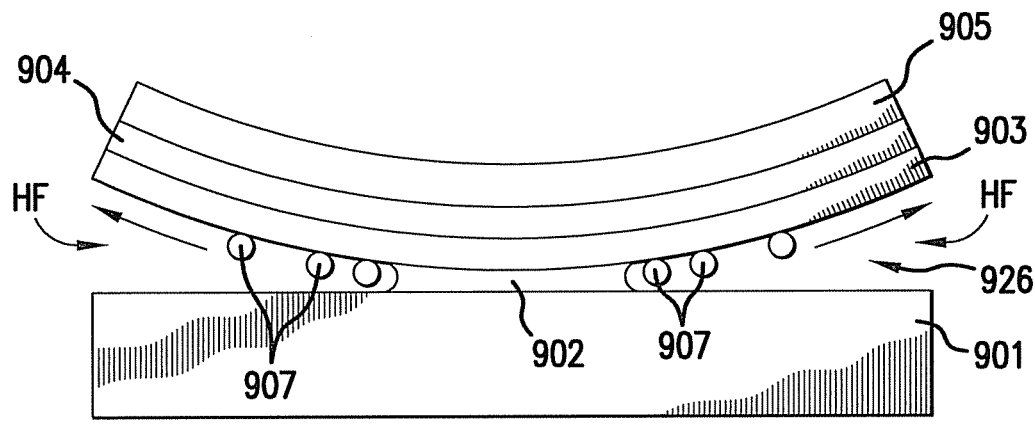
FIG. 6 is a cross-sectional view of a second method of epitaxial lift off known in the prior art.

FIG. 6 is a side elevational view showing an epitaxially grown thin film semiconductor device being peeled from an underlying single crystal substrate by the etching technique of U.S. Pat. No. 4,846,931 (Gmitter et al.) in which a support layer 905 is applied so as to be under tension such that as undercutting of the release layer 902 occurs, the film curls with a radius of curvature R thereby forming a non-uniform channel 926 which is wider at the edges than the center of the film. The bubbles 907, or reaction products of the etching process, are thus able to be released more quickly and efficiently.

Figure 7:
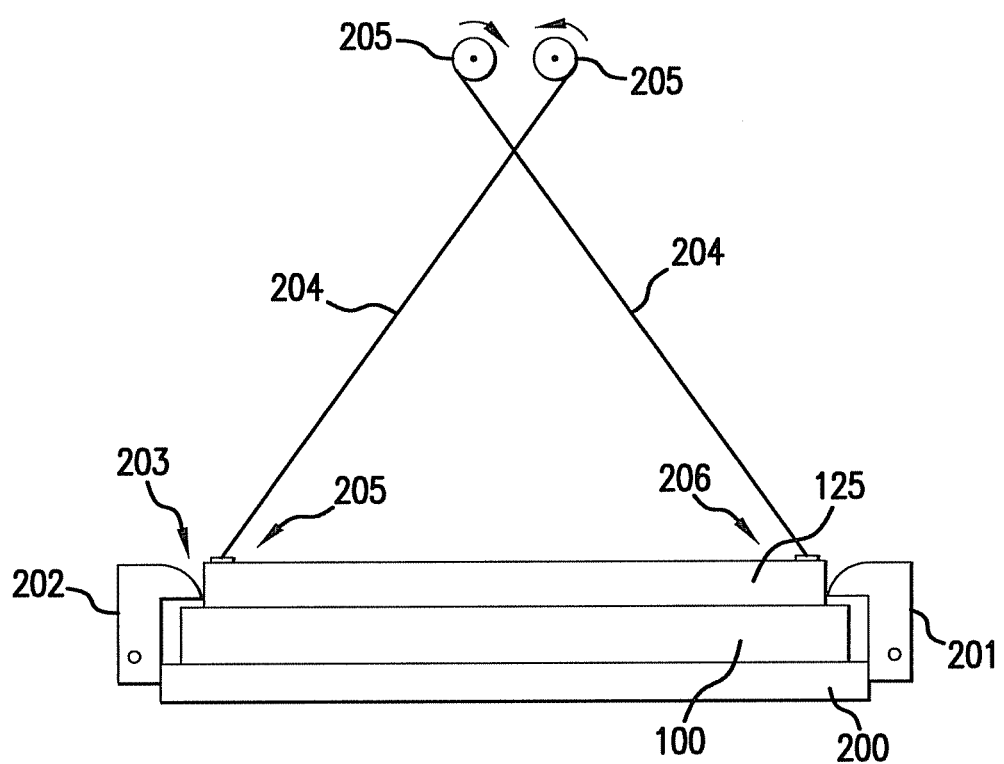
FIG. 7 is a cross-sectional view of the arrangement for epitaxial lift off according to the present invention.

FIG. 7 is a side elevational view showing an epitaxially grown thin film semiconductor device being peeled from an underlying single crystal substrate by the etching technique of the present invention. The substrate 100 is held against a bottom support plate 200 by a mechanical lever 201. A connecting link element 204 is attached to the periphery of the back of the flexible film 125 by at least two opposed points. The link elements 204 are attached to a pulley 205 which turns so as to put tension on the link and lift the ends of the flexible film 125. The solar cell having the flexible film bonded thereon is introduced into an etchant environment such as hydrofluoric acid (HF) that can be, for example, a liquid solution or an atmosphere containing an etchant aerosol. As the ends of the flexible film 125 are lifted, the etching or undercutting of the separation layer 103c (shown in FIG. 4) occurs, the epitaxial layer and surrogate substrate curls from the periphery thereby forming a non-uniform channel 926 which is wider at the edges than the center of the structure. The bubbles, or reaction products of the etching process, are thus able to be released more quickly and efficiently.

Figure 8A:
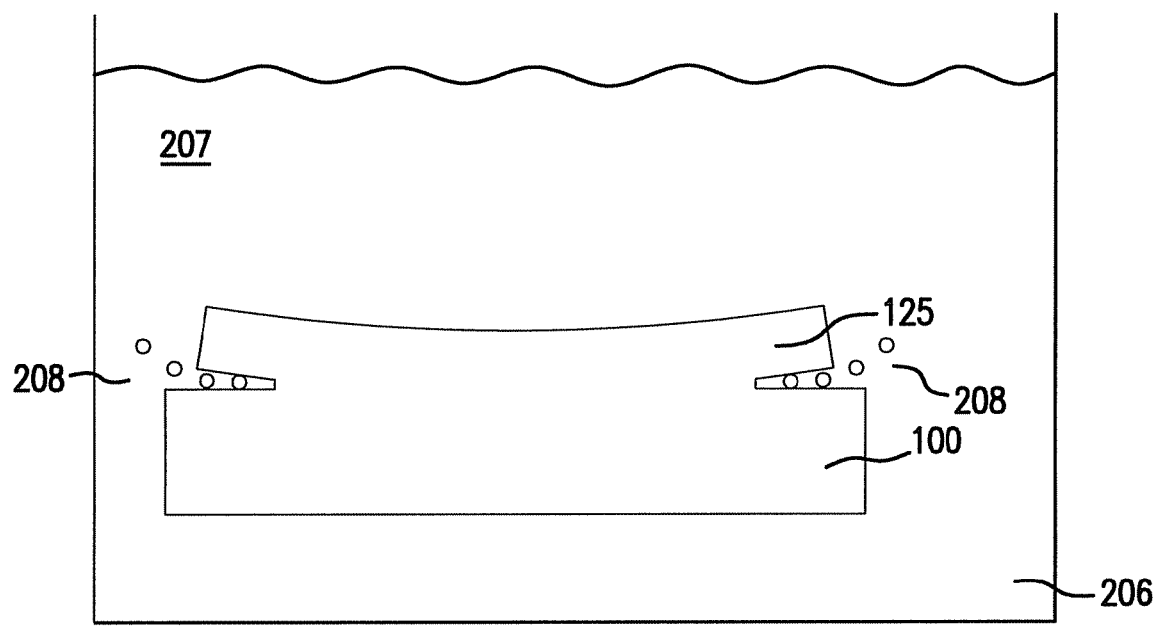
FIG. 8A is another embodiment of an arrangement for epitaxial lift off according to the present invention.

FIG. 8A is a side elevational view showing an epitaxially grown thin film semiconductor device being peeled from an underlying single crystal substrate by the etching technique generally according to a first embodiment of the present invention. The semiconductor structure is immersed in a container 207 holding the etchant solution 206, and the figure depicts the flexible film 125 and the epitaxial layers being released from the substrate 100, as the bubbles or reaction products 208 are released from the region of the separation layer 103c. The specific mechanical lifting technique depicted in FIG. 7 is only one representative embodiment, and accordingly the link elements 204 attached to a pulley 205 are not depicted to simplify the drawing.

Figure 8B:
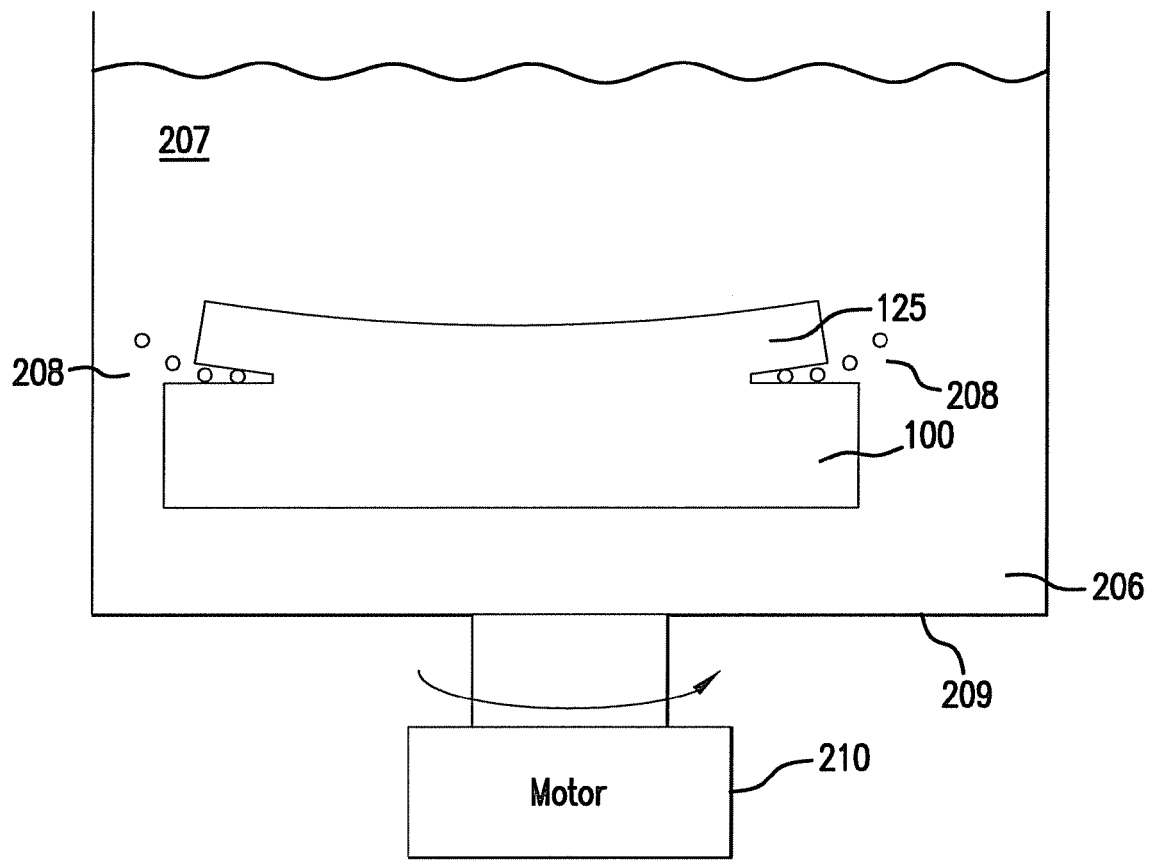
FIG. 8B is another embodiment of an arrangement for epitaxial lift off according to the present invention.

FIG. 8B is a side elevational view showing an epitaxially grown thin film semiconductor device being peeled from an underlying single crystal substrate by the etching technique according to a second embodiment of the present invention. The semiconductor structure is immersed in a container 207 holding the etchant solution 206. The container is agitated, such as by a motor 210, which causes the solution 206 to be more vigorously applied to the separation layer 103c, and to allow the bubbles or reaction products 208 to be more rapidly released from the region of the separation layer 103c by virtue of the moving solution.

Figure 8C:
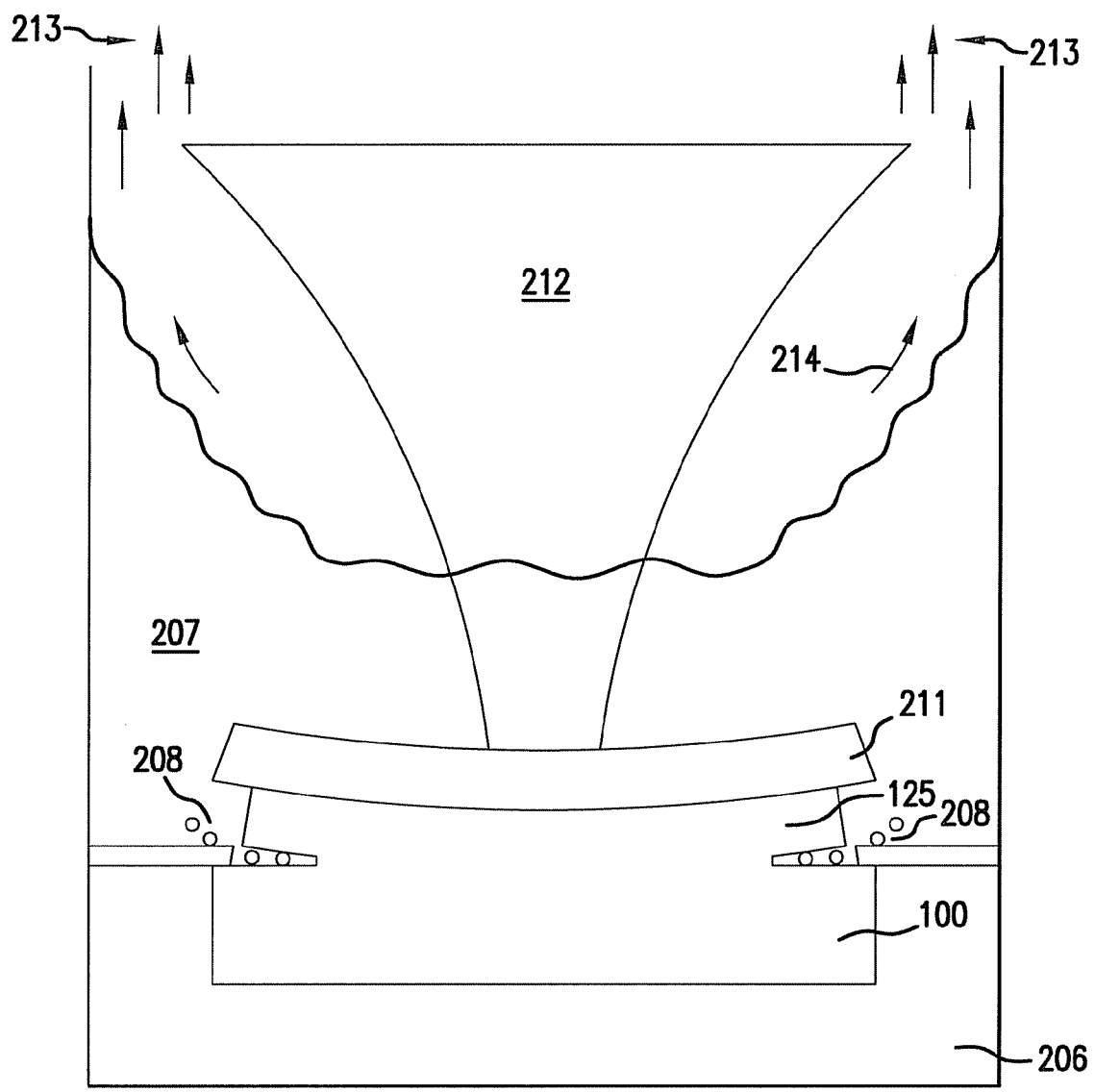
FIG. 8C is another embodiment of an arrangement for epitaxial lift off according to the present invention.

FIG. 8C is a side elevational view showing an epitaxially grown thin film semiconductor device being peeled from an underlying single crystal substrate by the etching technique according to a third embodiment of the present invention. The semiconductor structure is immersed in a container 207 holding the etchant solution 206. A pliable member 211 is attached to the back surface of the flexible film 125. A funnel shaped member 212 is attached to the center of the pliable member 211. Air suction 213 is then applied to the exterior of the funnel member 212, causing the pliable member 211 and flexible film 125 to experience a force which increases with the distance from the center, so that along the periphery of the sides of the container 207, the solution 214 is pulled up and along the sides, and the ends of the pliable member 211 and the flexible film 125 are also pulled up. This again allows the bubbles or reaction products 208 to be more rapidly released from the region of the separation layer 103c by virtue of the pulling peripheral force and moving solution. The solution 214 that is evacuated from the top of the container 207 may be reintroduced in the bottom of the container so that the semiconductor structure is continually immersed in the solution 206 while the etching process of the separation layer continues.

Figure 9A:
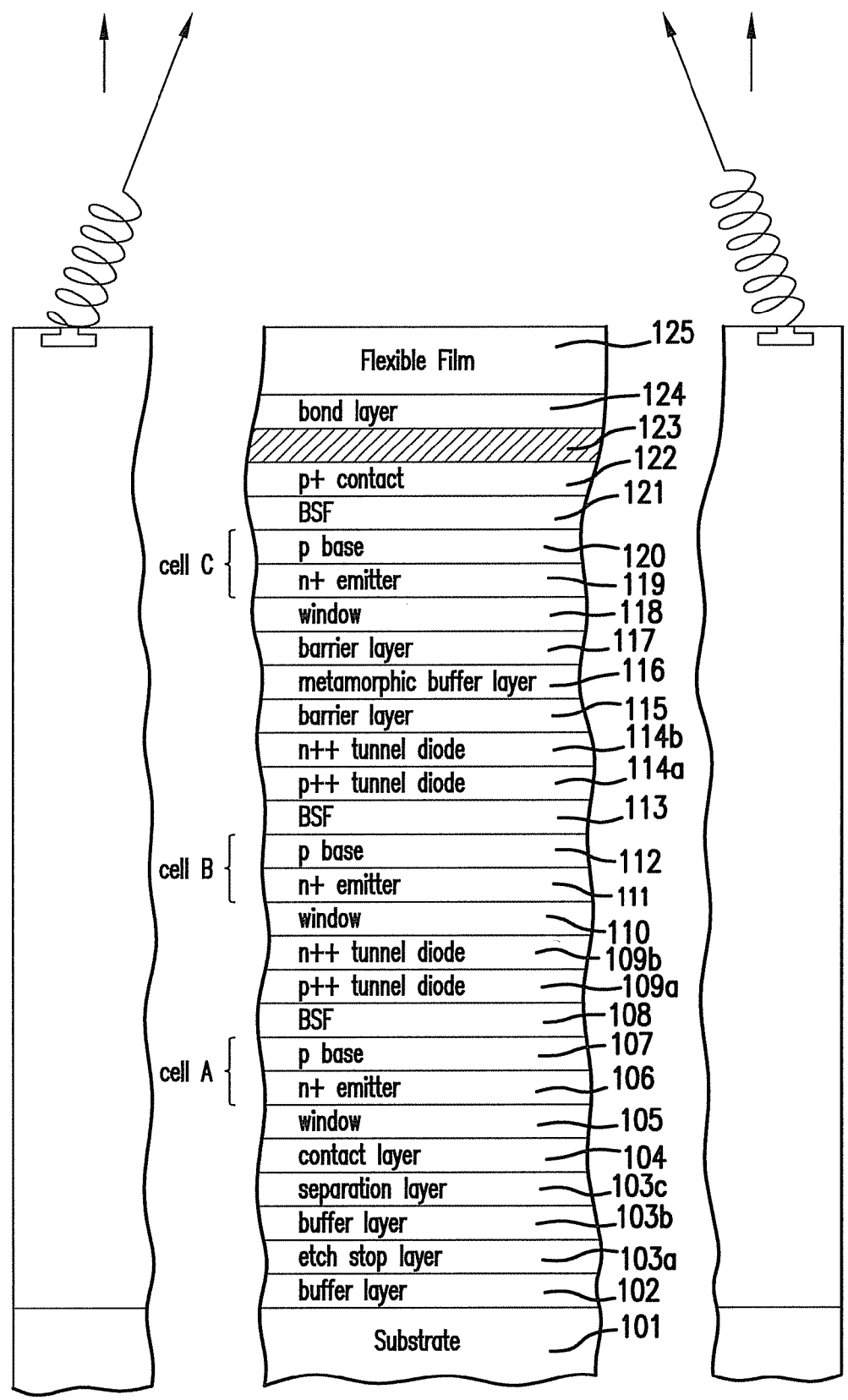
FIG. 9A is an enlarged cross-sectional view of the solar cell prior to epitaxial lift off according to the present invention.

FIG. 9A is an enlarged cross-sectional view of the solar cell prior to epitaxial lift off according to the present invention.

Figure 9B:
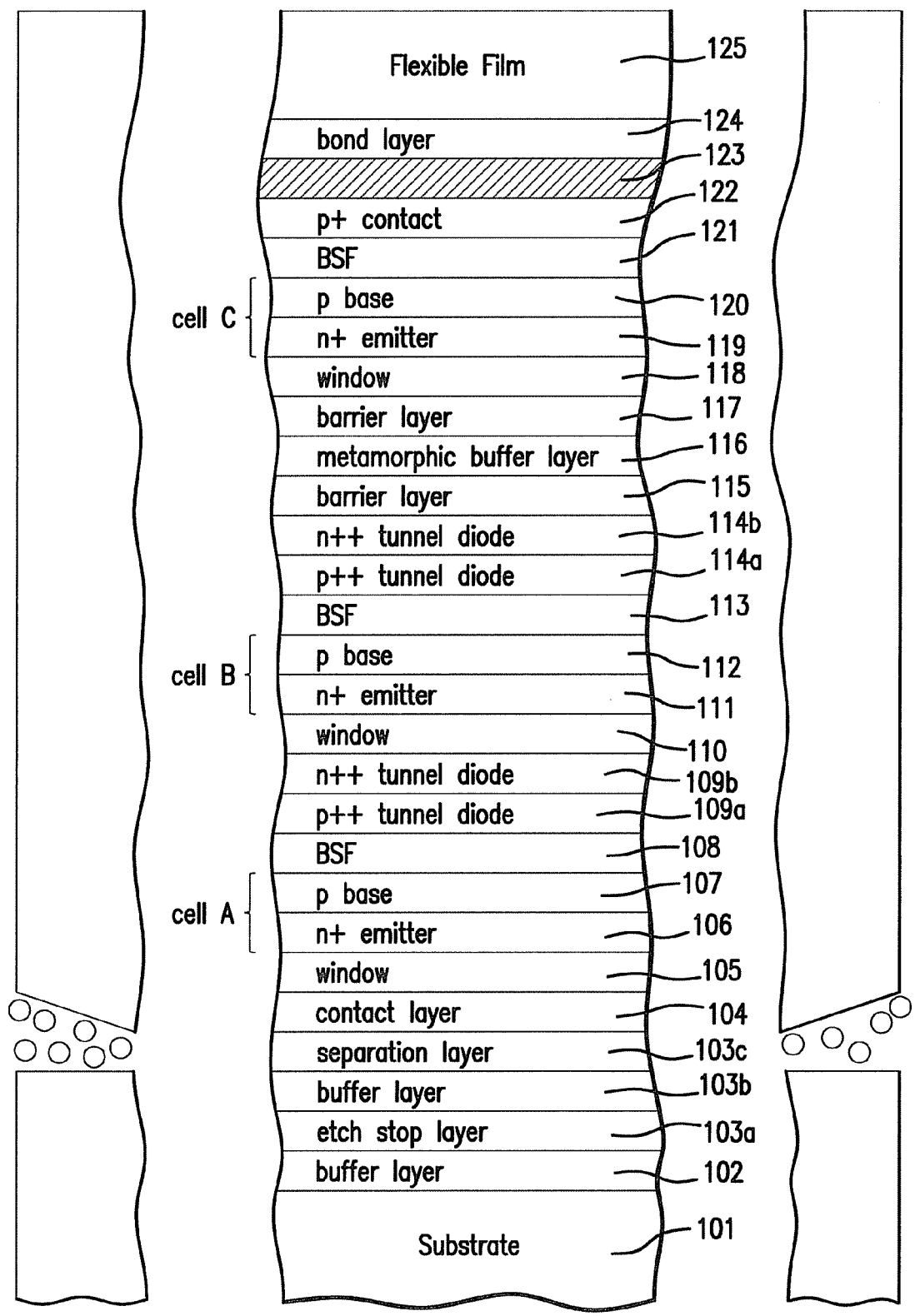
FIG. 9B is an enlarged cross-sectional view of the solar cell during the process of epitaxial lift off according to the present invention.

FIG. 9B is an enlarged cross-sectional view of the solar cell during the process of epitaxial lift off according to the present invention, showing the outer portion of the separation layer being etched away.

Figure 10A:
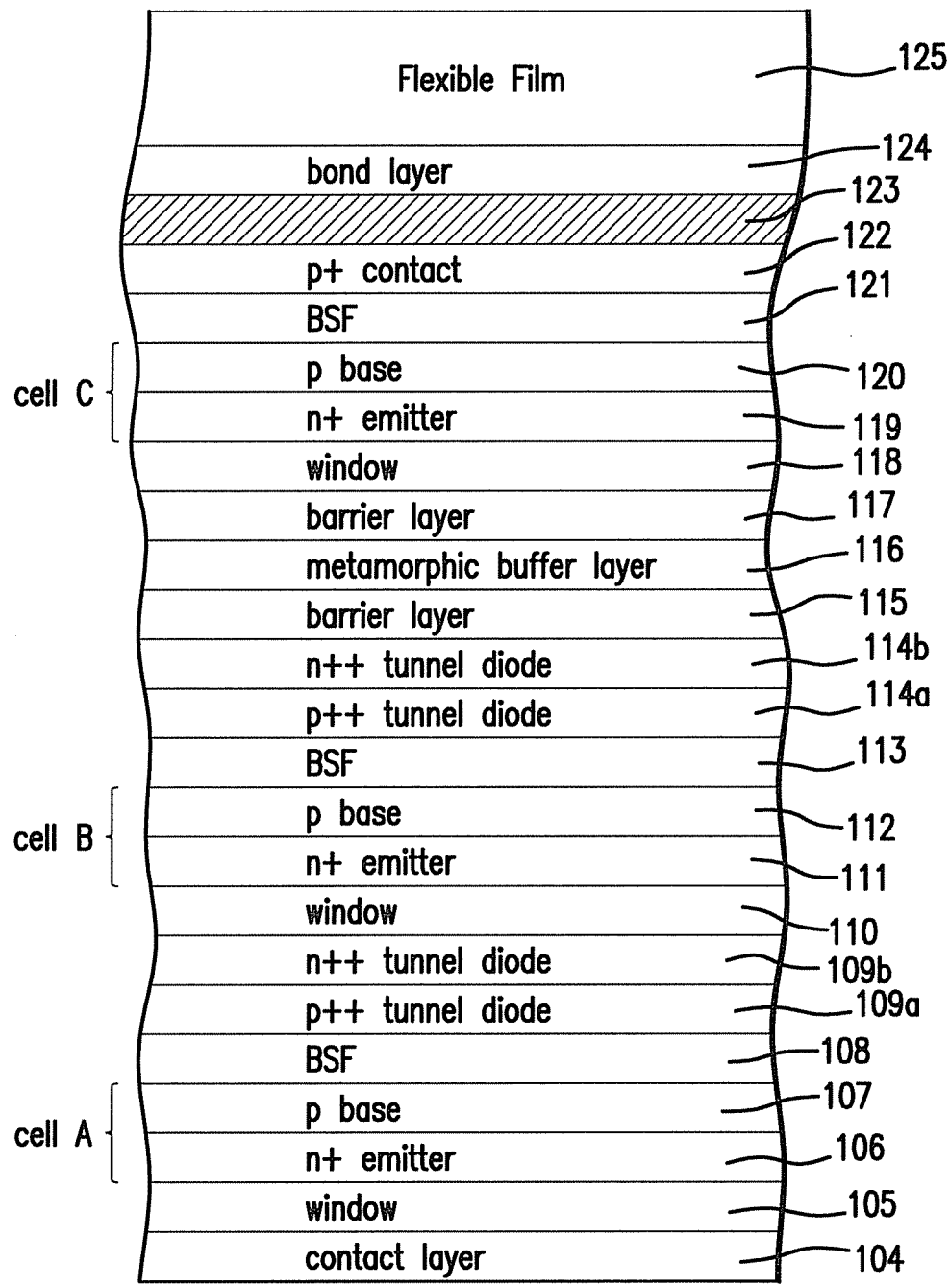
FIG. 10A is a cross-sectional view of the solar cell of FIG. 4 after the epitaxial lift off step in which the epitaxy has been removed from the original substrate.

FIG. 10A is a cross-sectional view of the solar cell of FIG. 9B after the process steps in which the original substrate is removed by the techniques described above.

Figure 10B:
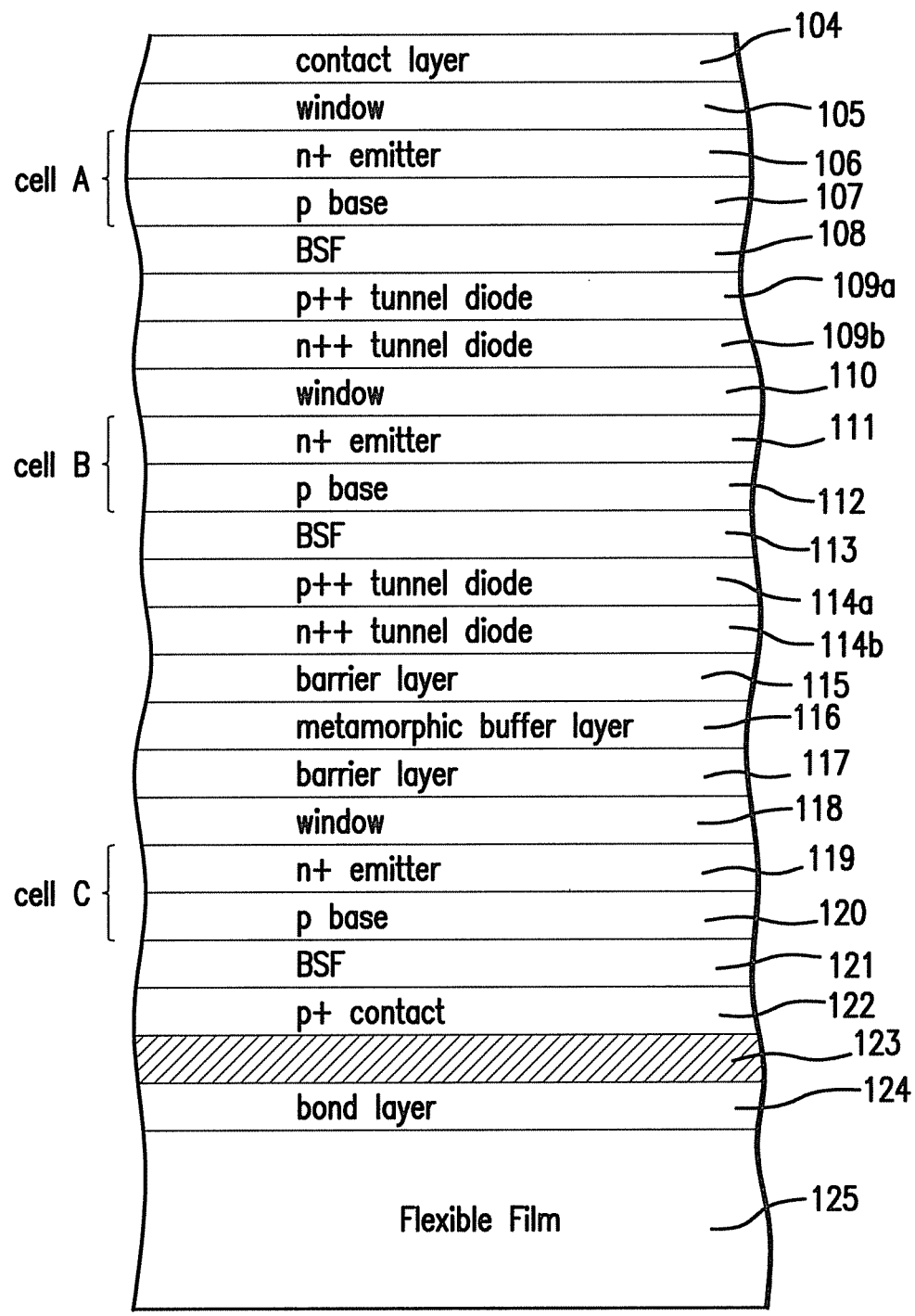
FIG. 10B is a cross-sectional view of the solar cell of FIG. 1 OA with the flexible film depicted on the bottom of the Figure.

FIG. 10B is a cross-sectional view of the solar cell of FIG. 10A with the orientation with the flexible film 125 being at the bottom of the Figure. Subsequent Figures in this application will assume such orientation.

Figure 11:
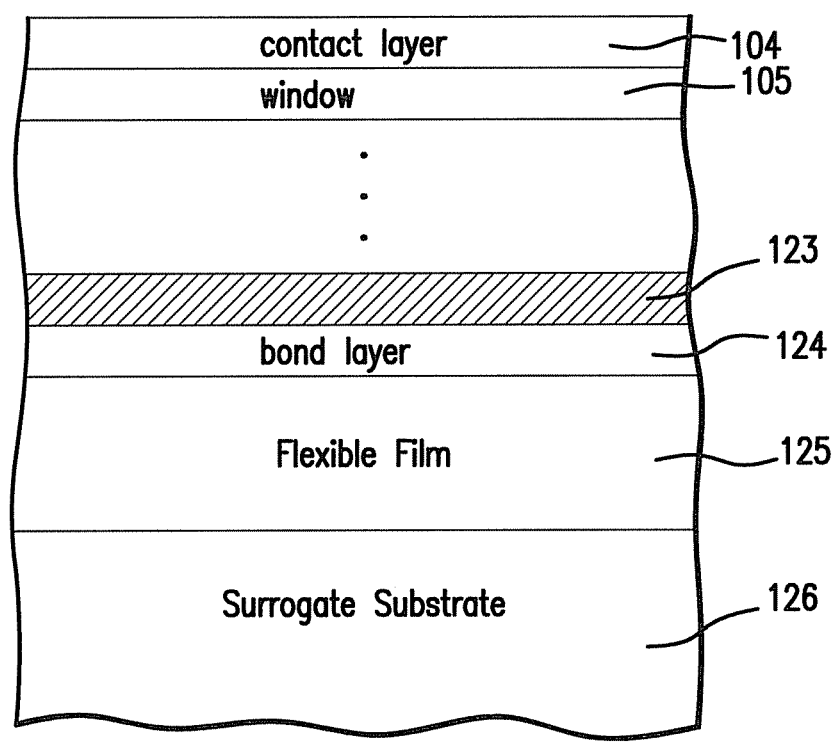
FIG. 11 is a simplified cross-sectional view of the solar cell of FIG. 10B.

FIG. 11 is a simplified cross-sectional view of the solar cell of FIG. 10B depicting just a few of the top layers and lower layers over the flexible film 125. In addition, surrogate substrate 126 has been attached over flexible film 125. In some embodiments, the surrogate substrate can be attached using an electrostatic technique. For example, an electrostatic chuck can be used to apply a charge to the surrogate substrate to cause the surrogate substrate to be electrostatically attached to the flexible film. In other embodiments, the surrogate substrate can be attached to the flexible film using an adhesive such as Wafer Bond (manufactured by Brewer Science, Inc. of Rolla, Mo.).

The surrogate substrate may be GaAs, Ge or Si, or other suitable material. The surrogate substrate can be about 40 mils in thickness. For embodiments in which the surrogate substrate is adhered to the flexible film using an adhesive, the surrogate substrate can optionally be perforated with holes about 1 mm in diameter, spaced 4 mm apart, to aid in subsequent removal of any adhesive and the substrate.

Figure 12:
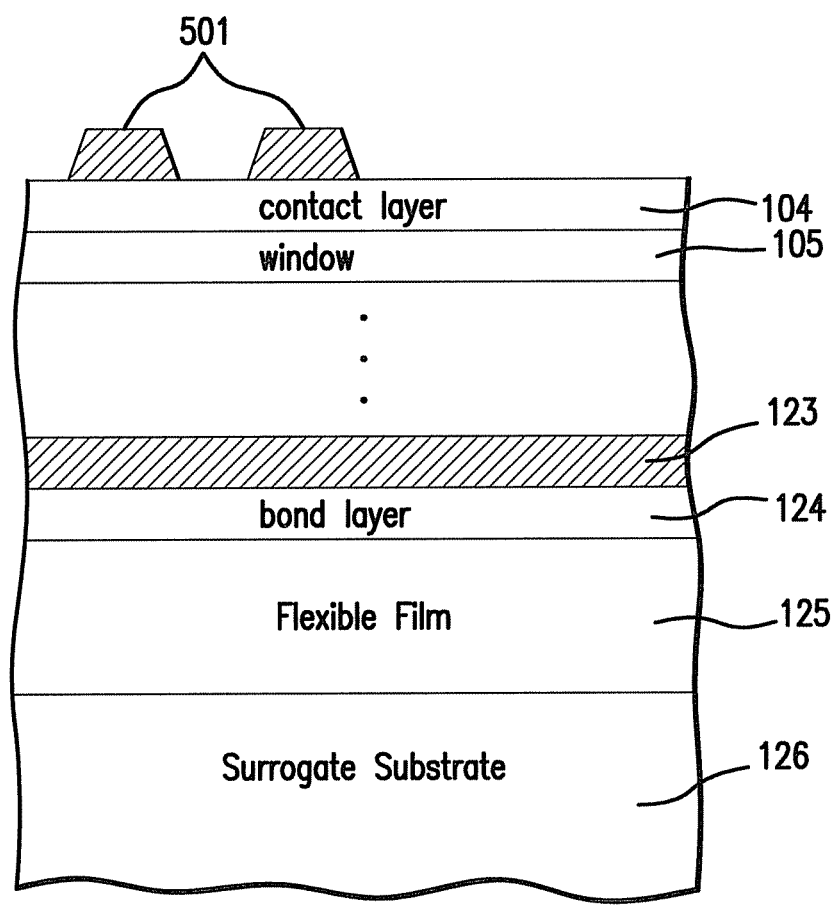
FIG. 12 is a cross-sectional view of the solar cell of FIG. 11 after the next process step.

FIG. 12 is a cross-sectional view of the solar cell of FIG. 11 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. patent application Pub. No. 2010/0012175 A1 (Varghese et al.), hereby incorporated by reference, the grid lines 501 are preferably composed of the sequence of layers Pd/Ge/Ti/Pd/Au, although other suitable sequences and materials may be used as well.

Figure 13:
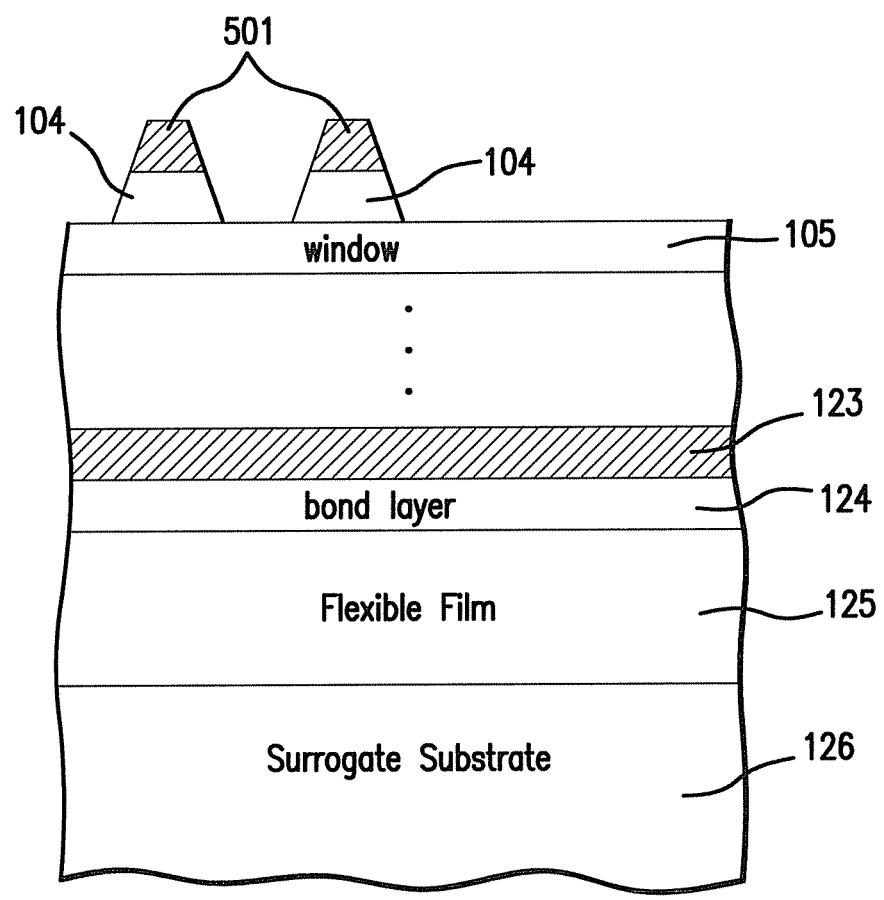
FIG. 13 is a cross-sectional view of the solar cell of FIG. 12 after the next process step.

FIG. 13 is a cross-sectional view of the solar cell of FIG. 12 after the next process step in which the grid lines are used as a mask to etch down the surface to the window layer 105 using a citric acid/peroxide etching mixture.

Figure 14A:
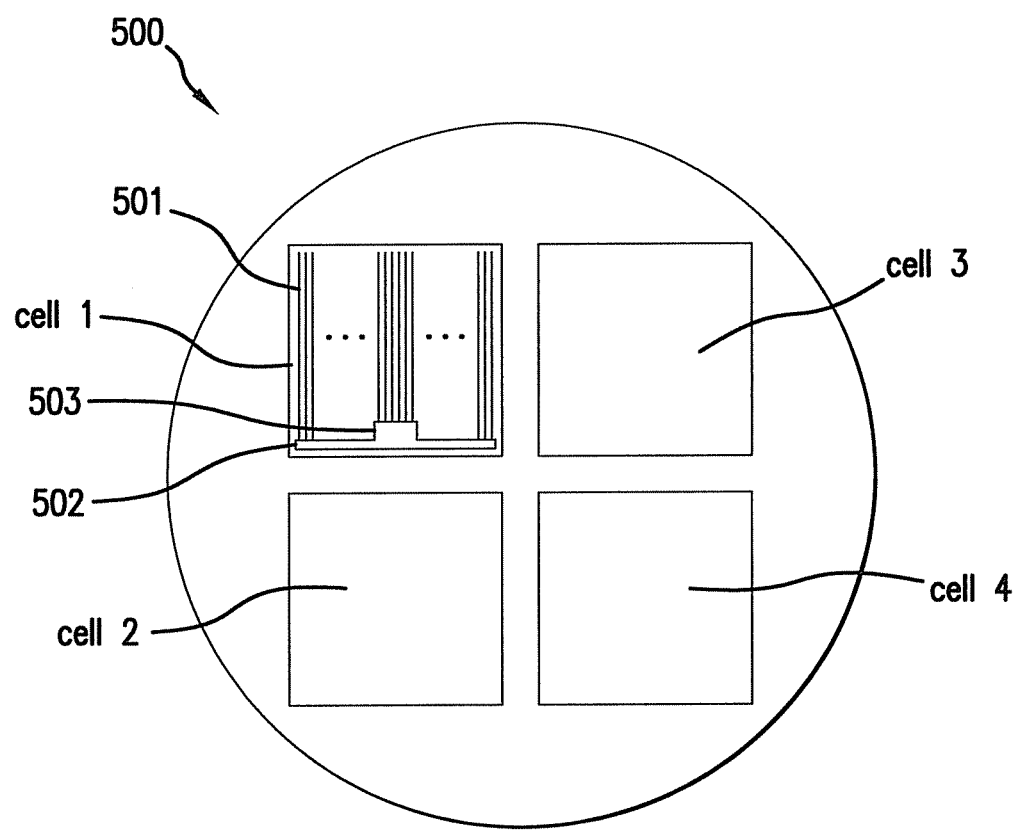
FIG. 14A is a top plan view of a wafer in which four solar cells are fabricated.

FIG. 14A is a top plan view of a 100 mm (or 4 inch) wafer in which four solar cells are implemented. The depiction of four cells is for illustration for purposes only, and the present invention is not limited to any specific number of cells per wafer.

In each cell there are grid lines 501 (more particularly shown in cross-section in FIG. 13), an interconnecting bus line 502, and a contact pad 503. The geometry and number of grid and bus lines and the contact pad are illustrative and the present invention is not limited to the illustrated embodiment.

Figure 14B:
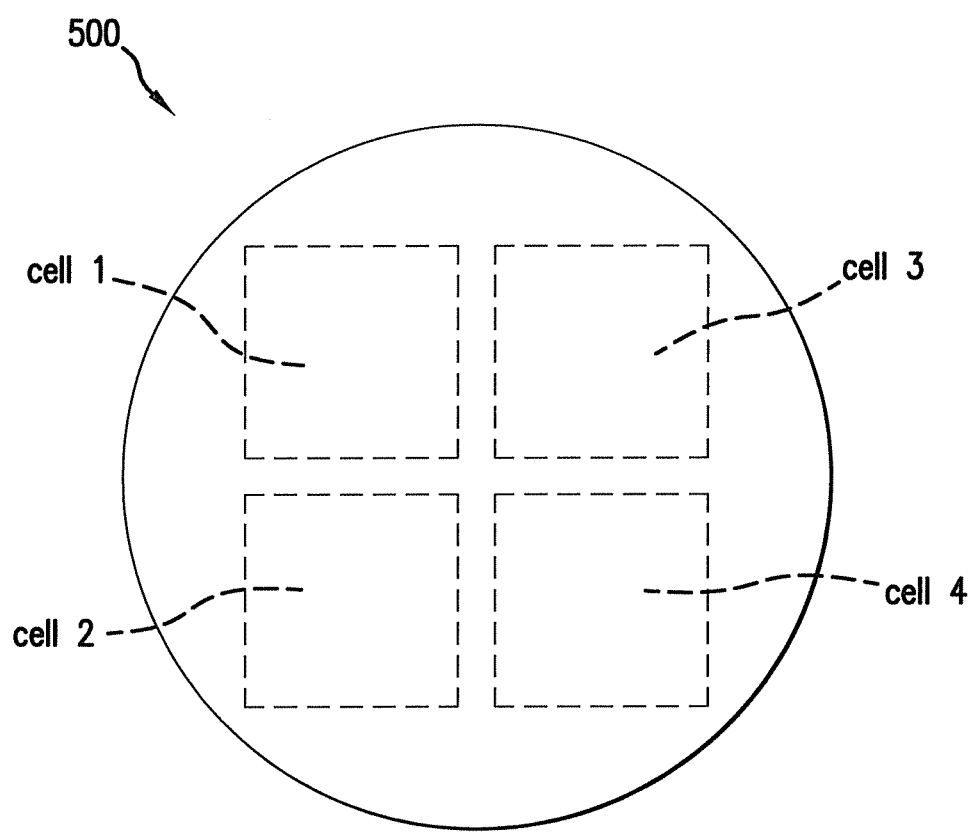
FIG. 14B is a bottom plan view of the wafer of FIG. 14A.

FIG. 14B is a bottom plan view of the wafer of FIG. 14A.

Figure 14C:
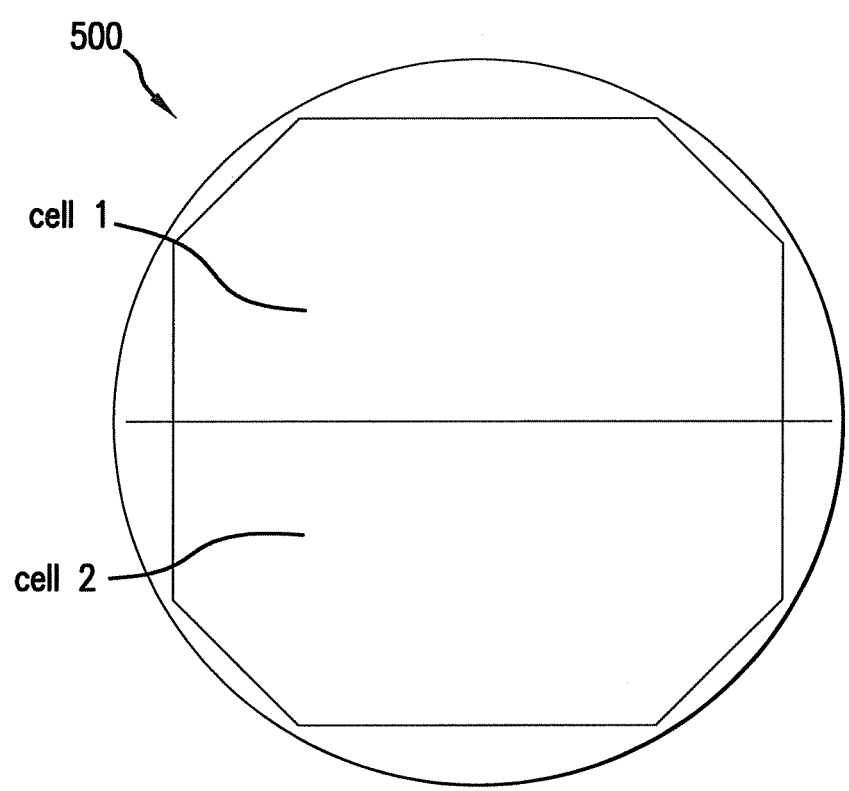
FIG. 14C is a top plan view of a wafer in which two solar cells are fabricated.

FIG. 14C is a top plan view of a 100 mm (or 4 inch) wafer in which two solar cells are implemented. Each solar cell has an area of 26.3 cm$^2$ and a power/weight ratio (after separation from the growth and surrogate substrates, and including a 4 mil thick cover glass) of 945 mW/g.

Figure 15:
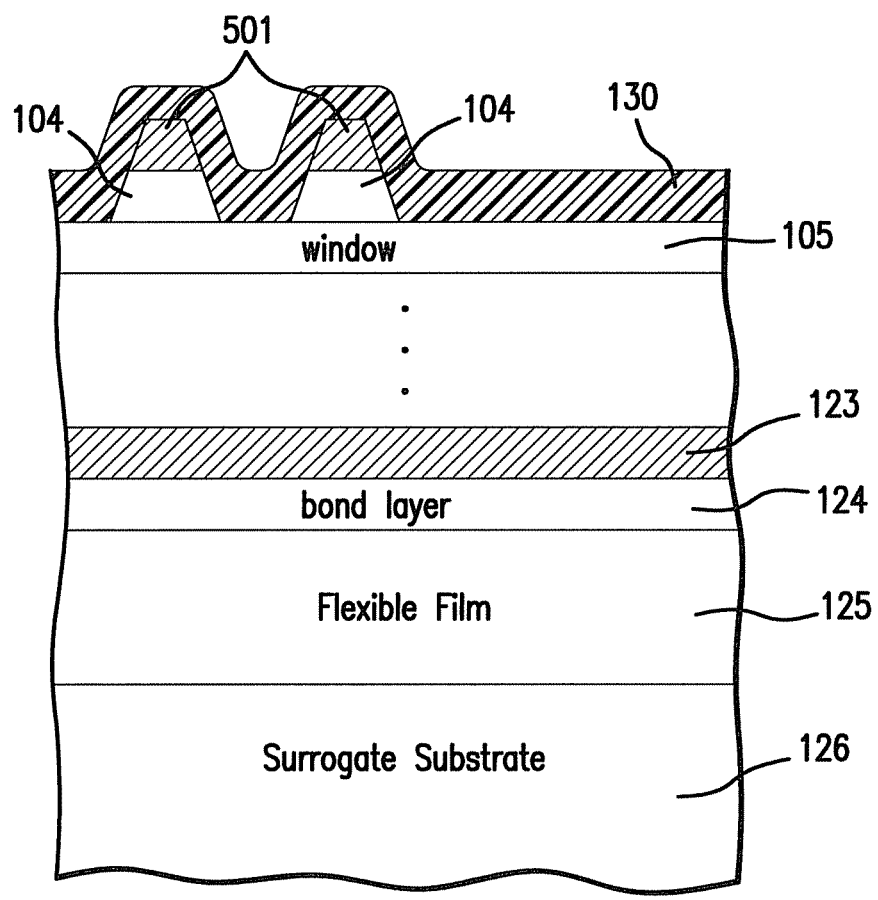
FIG. 15 is a cross-sectional view of the solar cell of FIG. 13 after the next process step.

FIG. 15 is a cross-sectional view of the solar cell of FIG. 13 after the next process step in which an antireflective (ARC) dielectric coating layer 130 is applied over the entire surface of the "top" side of the cell with the grid lines 501.

Figure 16A:
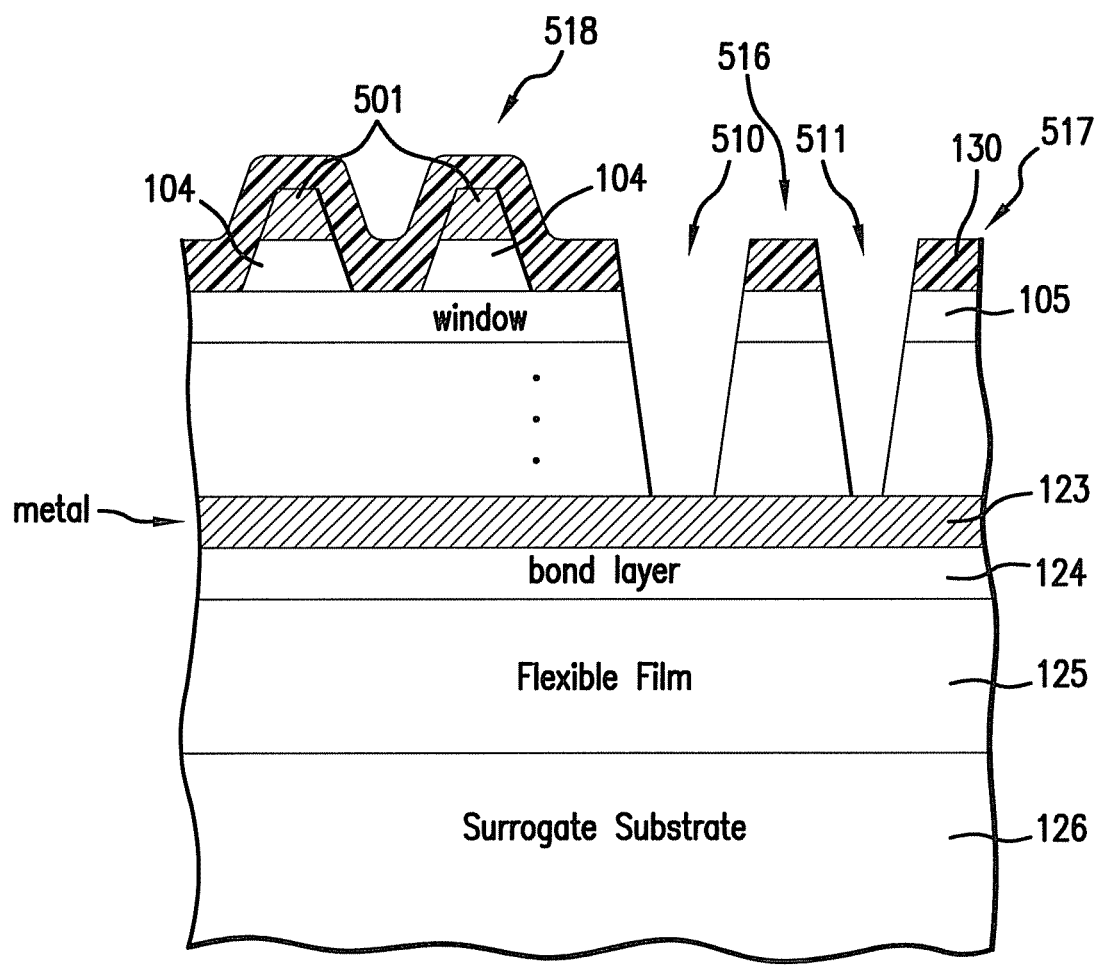
FIG. 16A is a cross-sectional view of the solar cell of FIG. 15 after the next process step.

FIG. 16A is a cross-sectional view of the solar cell of FIG. 15 after the next process step according to the present invention in which first and second annular channels 510 and 511, or portion of the semiconductor structure are etched down to the metal layer 123 using phosphide and arsenide etchants. These channels, as more particularly described in U.S. Pat. No. 7,741,146 B2 (Cornfeld et al.), define a peripheral boundary between the cell and the rest of the wafer, and leave a mesa structure which constitutes the solar cell. The cross-section depicted in FIG. 16A is that as seen from the A-A plane shown in FIG. 17A. In a preferred embodiment, channel 510 is substantially wider than that of channel 511.

Figure 16B:
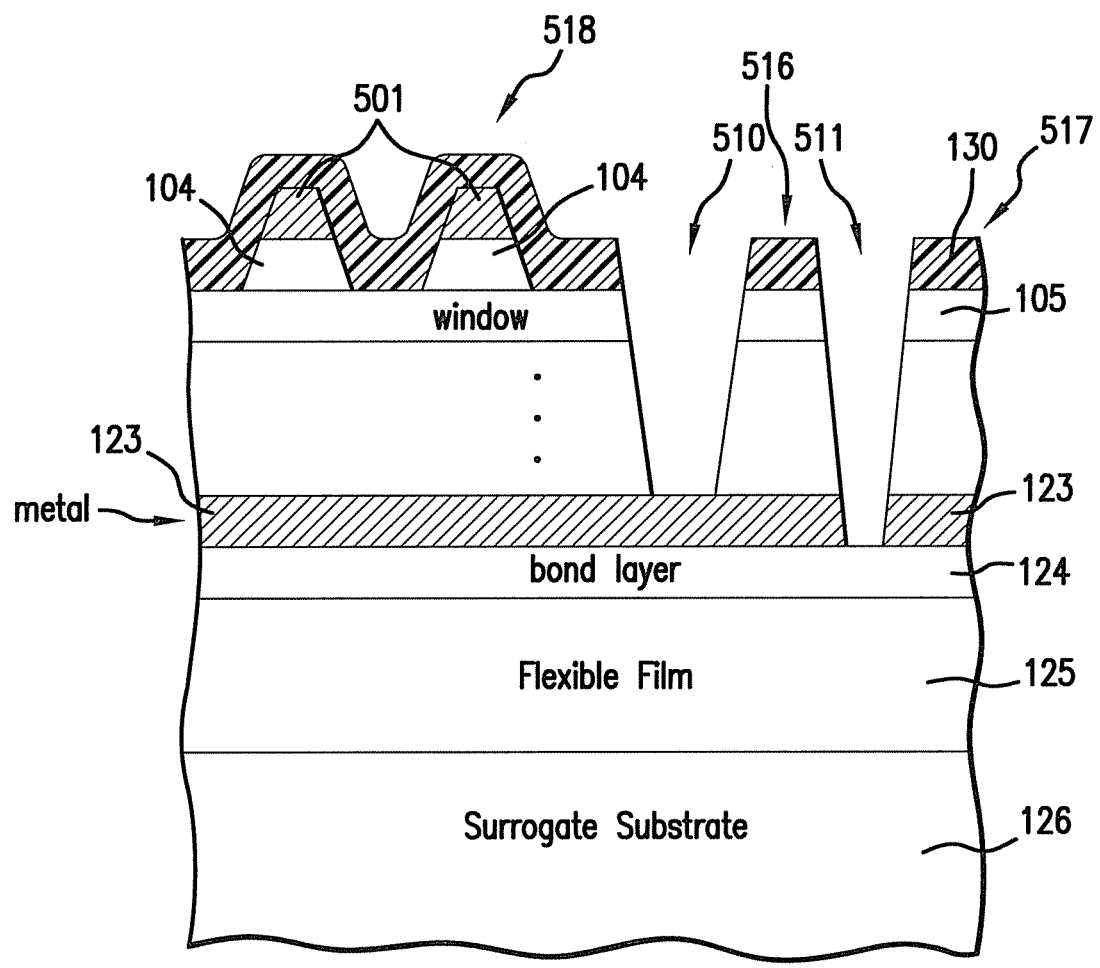
FIG. 16B is a cross-sectional view of the solar cell of FIG. 16A after the next process step.

FIG. 16B is a cross-sectional view of the solar cell of FIG. 16A after the next process step in which channel 511 is exposed to a metal etchant, layer 123 in the channel 511 is removed, and channel 511 is extended in depth approximately to the top surface of the adhesive layer 124.

Figure 17A:
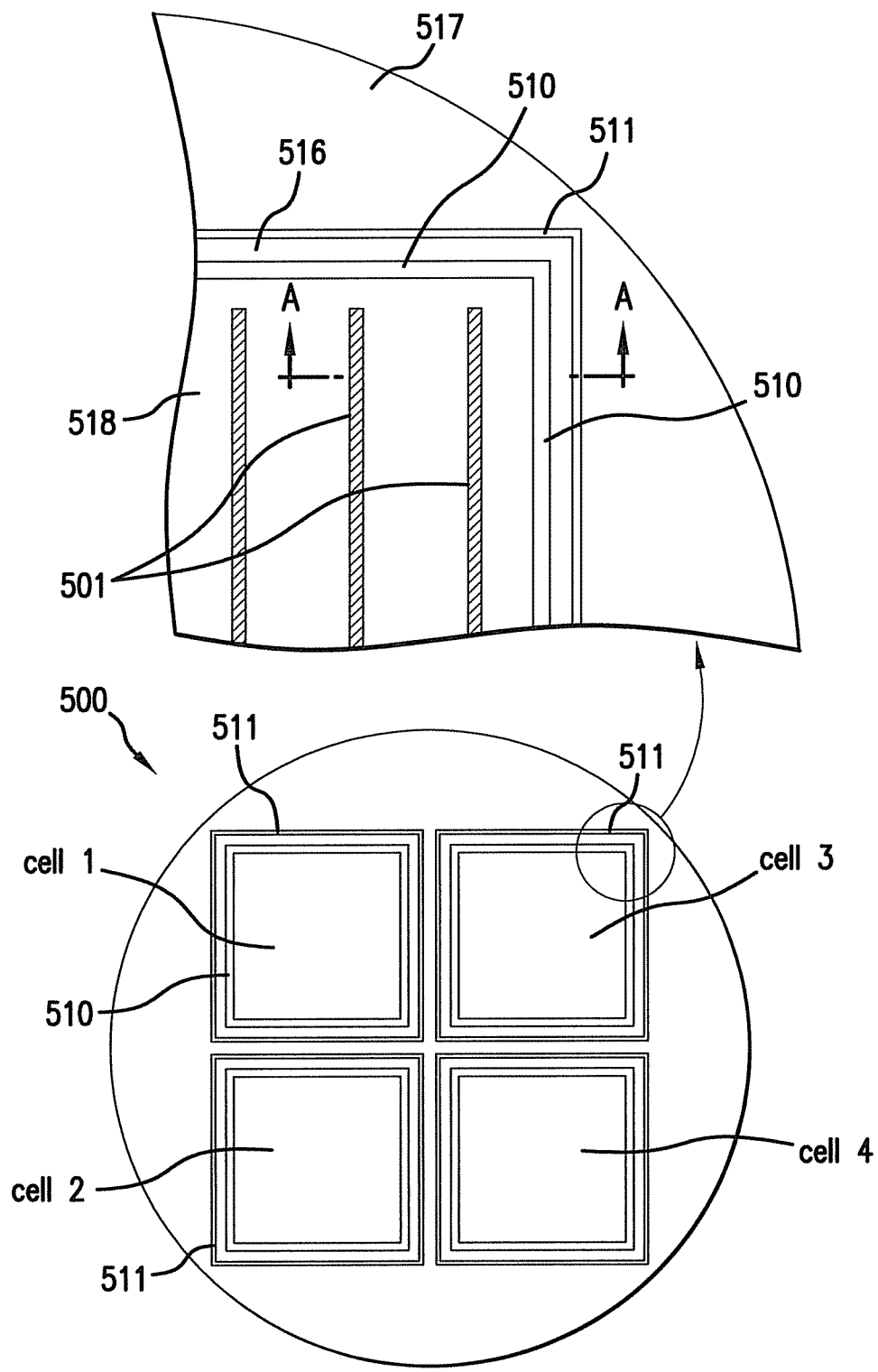
FIG. 17A is a top plan view of the wafer of FIG. 14A depicting the surface view of the trench etched around the cell, after the next process step.
Figure 17B:
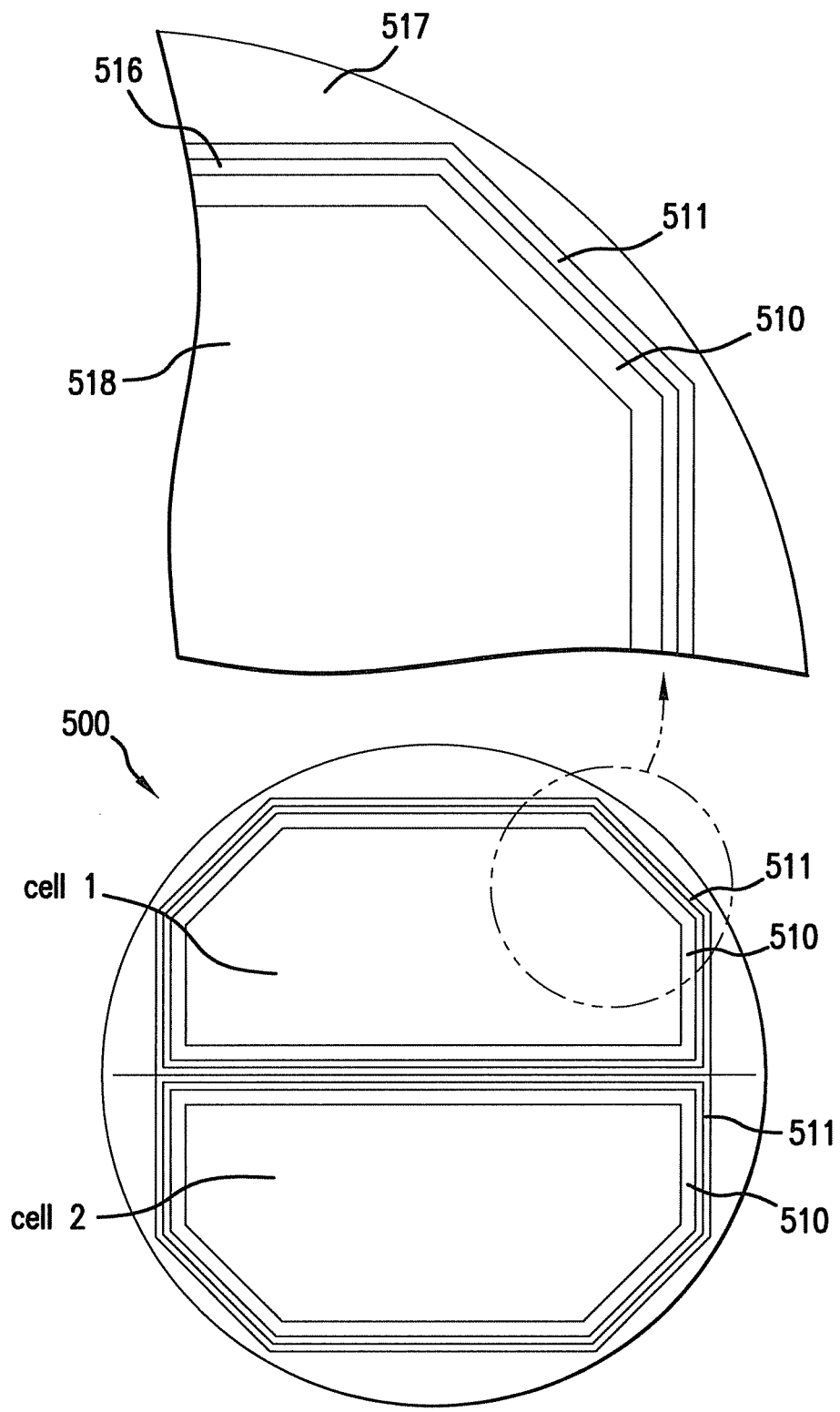
FIG. 17B is a cross-sectional view of the solar cell of FIG. 14C depicting the trench etched around the cell.

FIGS. 17A and 17B are top plan views of the wafer of FIGS. 14A and 14C, respectively, depicting the channels 510 and 511 etched around the periphery of each cell.

Figure 18A:
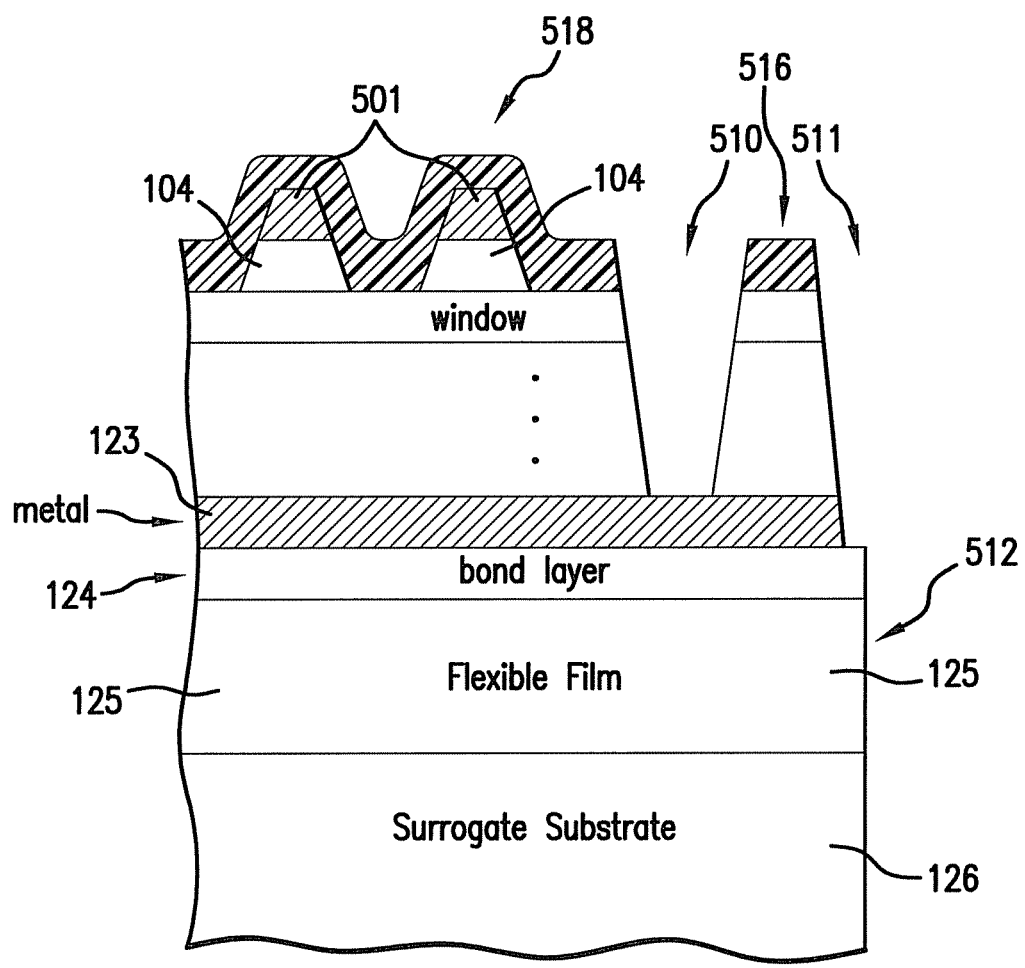
FIG. 18A is a cross-sectional view of the solar cell of FIG. 16B after the next process step in a first embodiment of the present invention.

FIG. 18A is a cross-sectional view of the solar cell of FIG. 16B after the individual solar cells (cell 1, cell 2, etc. shown in FIG. 17A) are cut or scribed from the wafer through the channel 511, leaving a vertical edge 512 extending through the flexible film 125 and the surrogate substrate 126.

Figure 18B:
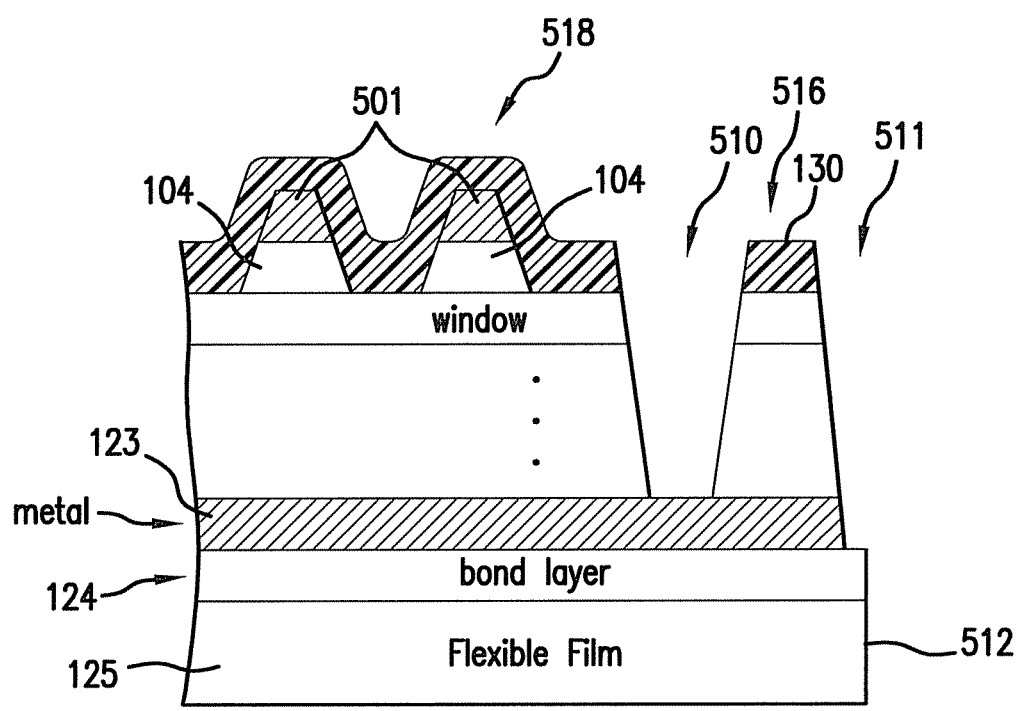
FIG. 18B is a cross-sectional view of the solar cell of FIG. 18A after the next process step in which the surrogate substrate is removed.

FIG. 18B is a cross-sectional view of the solar cell of FIG. 18A after the next process step in which the surrogate substrate 126 is removed. For embodiments in which the surrogate substrate is electrostatically attached to the flexible film, the surrogate substrate can be removed by using an electrostatic chuck to decharge the surrogate substrate to release it from the flexible film. For embodiments in which the surrogate substrate is attached to the flexible film using an adhesive, the surrogate substrate 126 can be removed by the use of the etchant 'Wafer Bond Solvent'. As noted above, the surrogate substrate can include perforations over its surface that allow the flow of etchant through the surrogate substrate 126 to permit its lift off. After lift off, the surrogate substrate may be reused in subsequent wafer processing operations. In this embodiment, the flexible film 125 forms the support for the solar cell in applications where a cover glass, such as provided in a second embodiment to be described below, is not required. In such an embodiment, electrical contact to the metal contact layer 123 may be made through the channel 510.

Figure 18C:
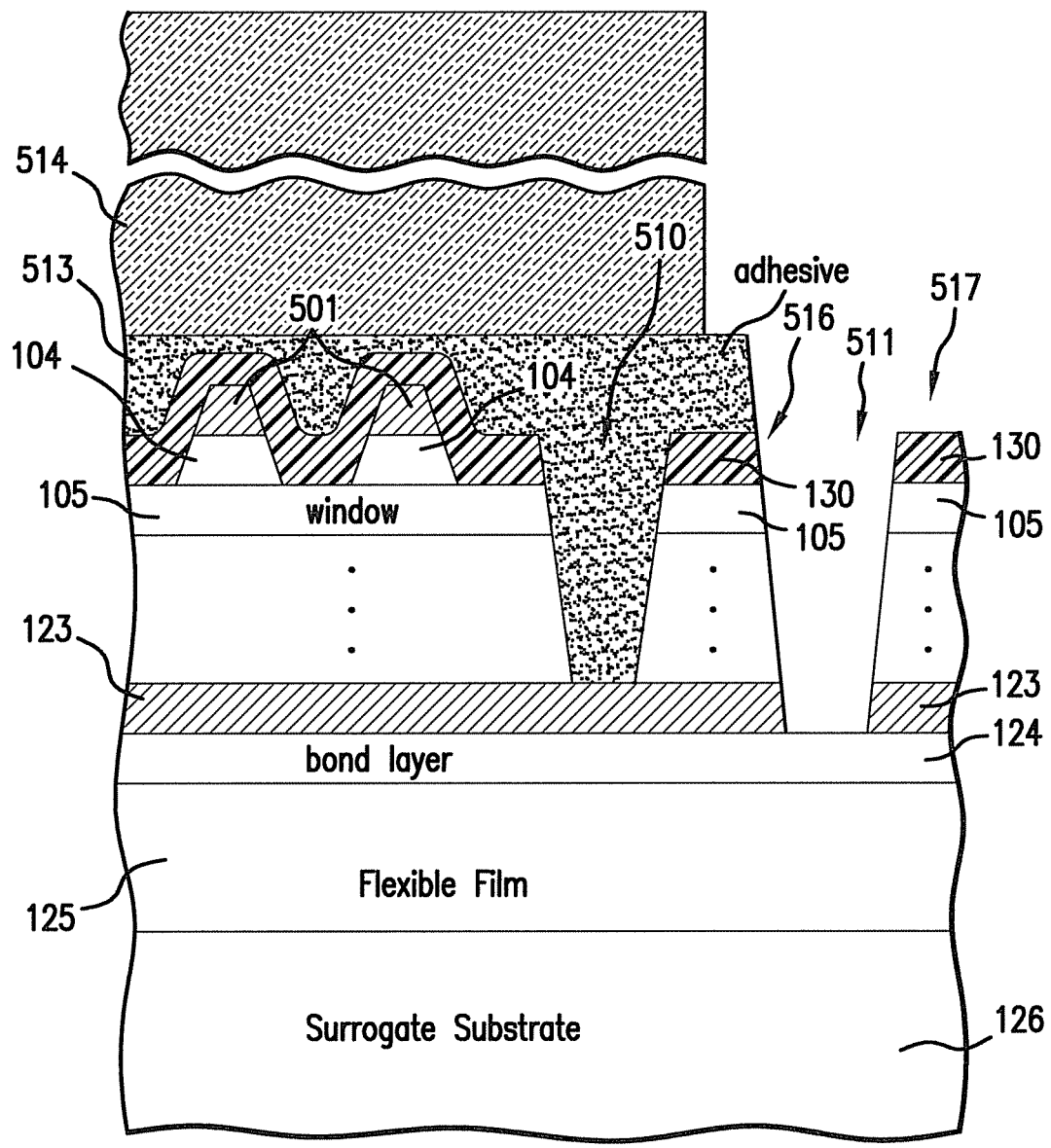
FIG. 18C is a cross-sectional view of the solar cell of FIG. 16B after the next process step in a second embodiment of the present invention in which a cover glass is applied to the top of the cell.

FIG. 18C is a cross-sectional view of the solar cell of FIG. 16B after the next process step in a second embodiment of the present invention in which a cover glass 514 is secured to the top of the cell by an adhesive 513. The cover glass 514 is typically about 4 mils thick and preferably covers the entire channel 510, but does not extend to channel 511. Although the use of a cover glass is desirable for many environmental conditions and applications, it is not necessary for all implementations, and additional layers or structures may also be utilized for providing additional support or environmental protection to the solar cell.

Figure 18D:
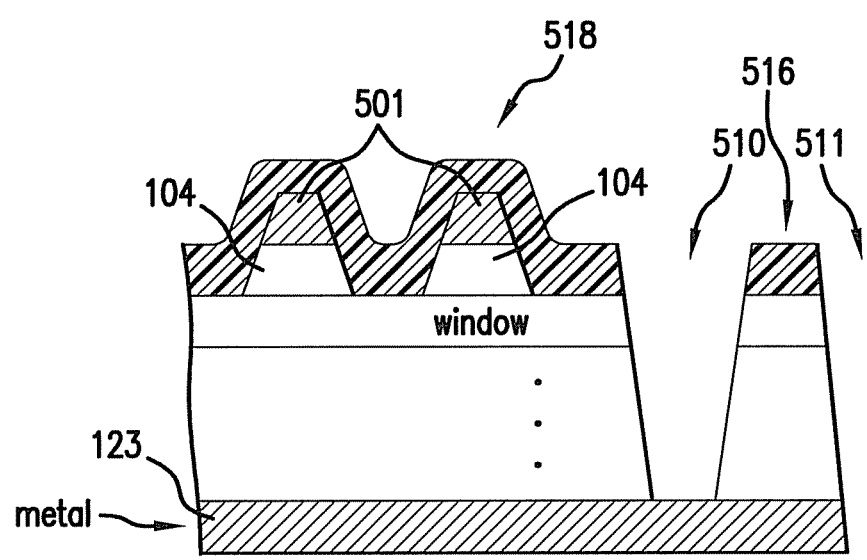
FIG. 18D is a cross-sectional view of the solar cell of FIG. 18B after the next process step in an embodiment of the present invention in which the flexible film is removed.

FIG. 18D is a cross-sectional view of the solar cell of FIG. 18B after the next process step in an embodiment of the present invention in which the flexible film 125 is removed. The flexible film 125 is preferably removed by the use of the etchant 'Wafer Bond Solvent'.

Figure 19:
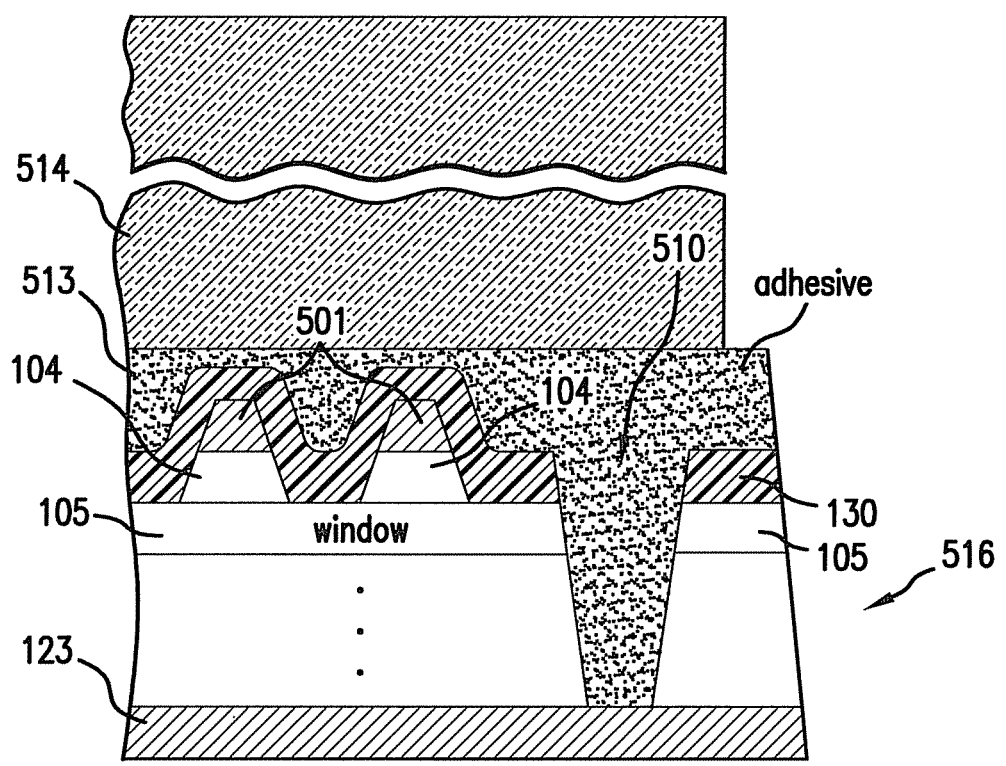
FIG. 19 is a cross-sectional view of the solar cell of FIG. 18D after the next process step in which a cover glass is applied to the top of the cell.

FIG. 19 is a cross-sectional view of the solar cell of FIG. 18D after the next process step in some embodiments of the present invention in which the adhesive layer 124, the flexible film 125 and the peripheral portion 512 of the wafer is entirely removed, leaving only the solar cell with the cover glass 514 (or other layers or structures) on the top, and the metal contact layer 123 on the bottom, which forms the backside contact of the solar cell.

Figure 20:
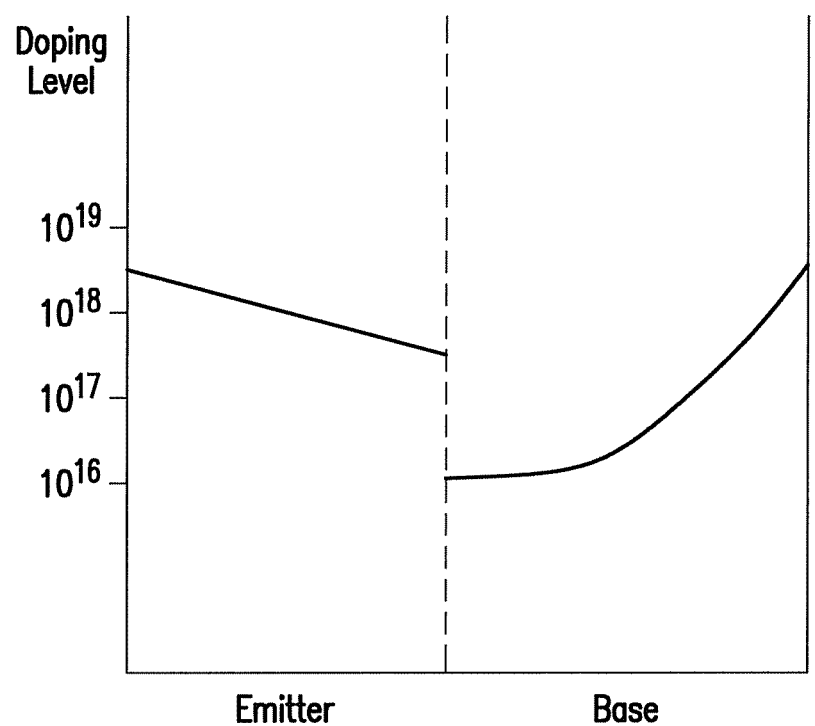
FIG. 20 is a graph of the doping profile in the base and emitter layers of a subcell in the metamorphic solar cell according to the present invention.

FIG. 20 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Pub. No. 2009/0155952 A1 (Stan et al.), herein incorporated by reference. The doping profiles depicted herein are merely illustrative, and other more complex profiles may be utilized as would be apparent to those skilled in the art without departing from the scope of the present invention.

Figure 21:
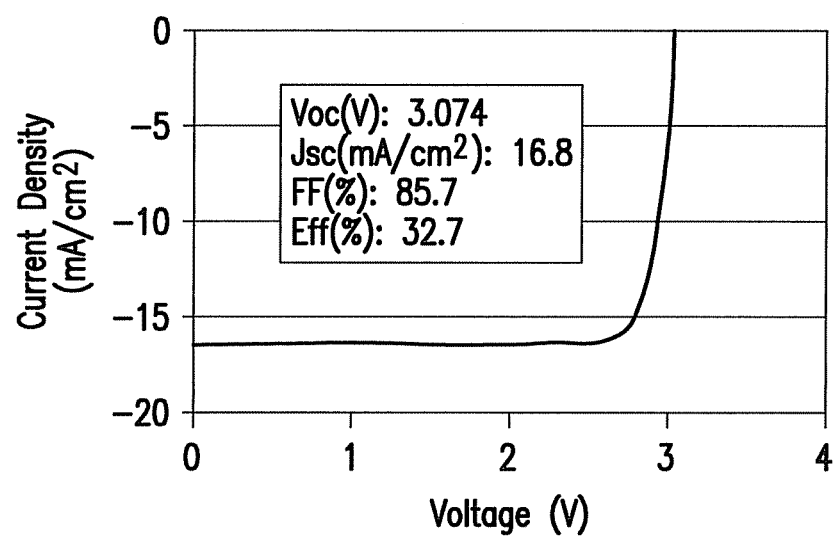
FIG. 21 is a graph that depicts the current and voltage characteristics of an inverted metamorphic multijunction solar cell according to the present invention.

FIG. 21 is a graph that depicts the current and voltage characteristics of the solar cell according to the present invention. The solar cell has an open circuit voltage ($V_o$) of approximately 3.074 volts, a short circuit current of approximately 16.8 mA/cm$^2$, a fill factor of approximately 85.7%, and an efficiency of 32.7%.

Figure 22:
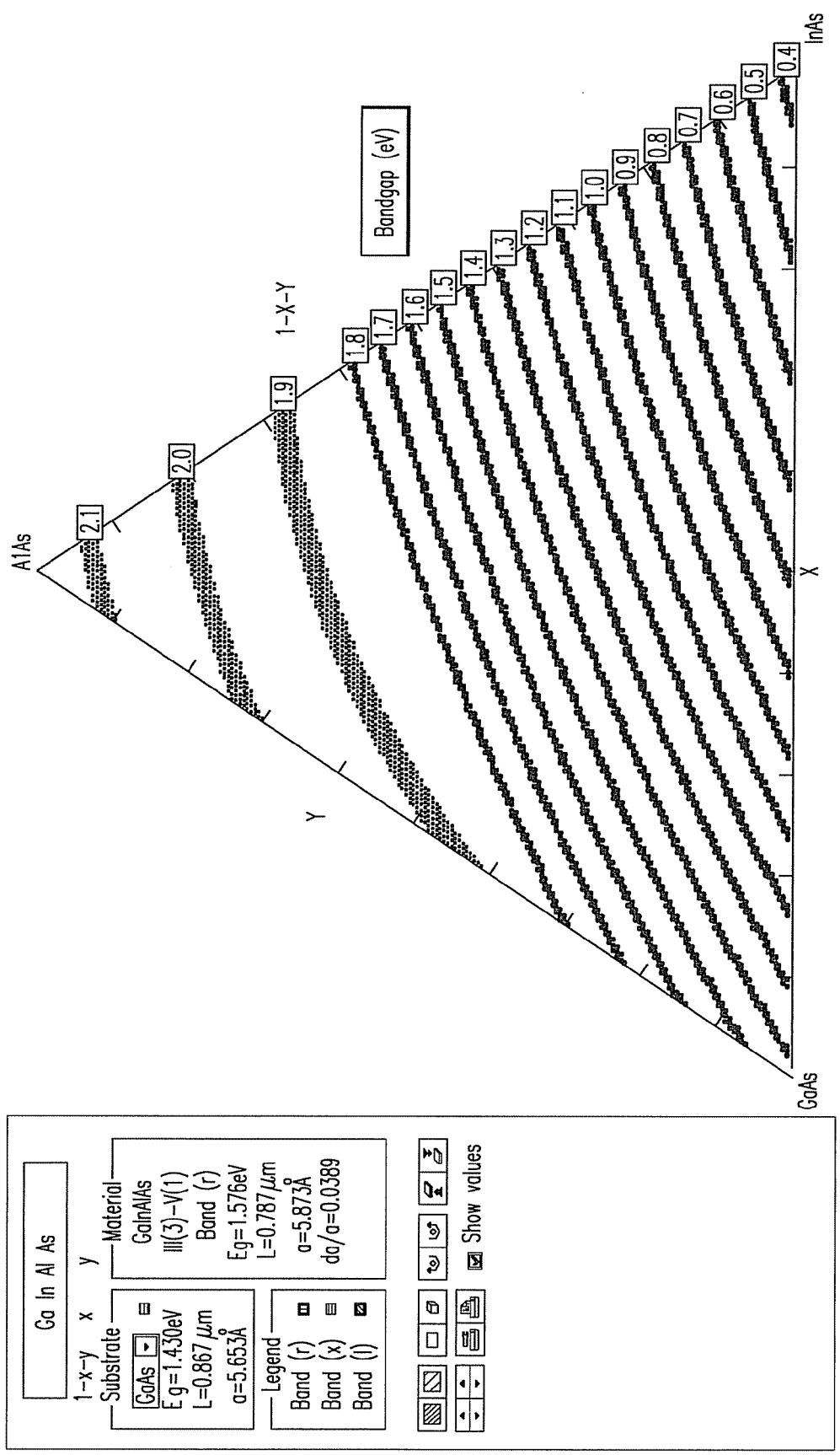
FIG. 22 is a diagram representing the relative concentration of Al, In, and Ga in an AlGaInAs material system needed to have a constant band gap with various designated values (ranging from 0.4 eV to 2.1 eV) as represented by curves on the diagram.

FIG. 22 is a diagram representing the relative concentration of Al, In, and Ga in an AlGaInAs material system needed to have a constant band gap with various designated values (ranging from 0.4 eV to 2.1 eV) as represented by curves on the diagram. The range of band gaps of various GaInAlAs materials is represented as a function of the relative concentration of Al, In, and Ga. This diagram illustrates how the selection of a constant band gap sequence of layers of GaIn-AlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 23:
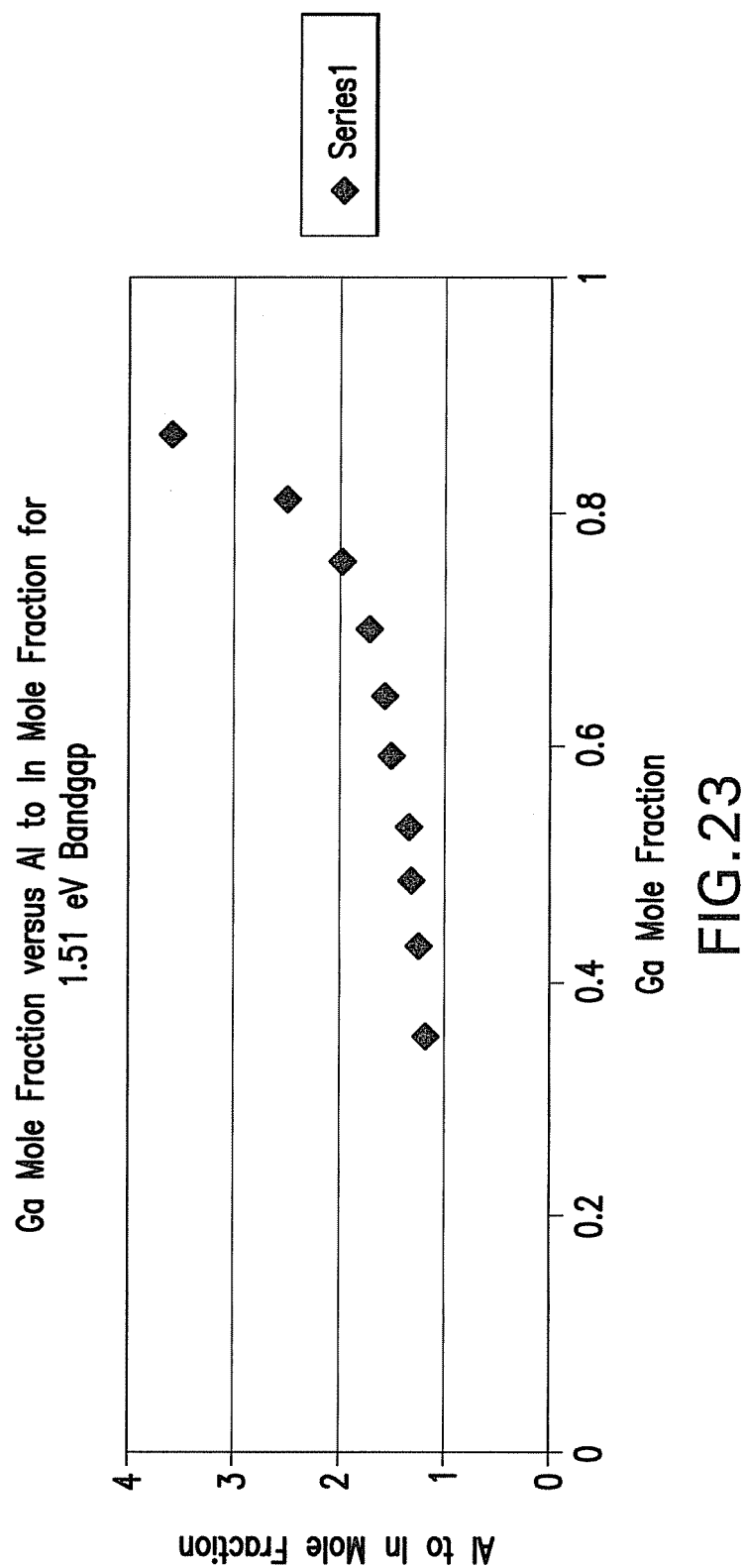
FIG. 23 is a graph representing the Ga mole fraction to the Al to In mole fraction in a AlGaInAs material system that is necessary to achieve a constant 1.51 eV band gap.

FIG. 23 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.51 eV band gap.

Figure 24:
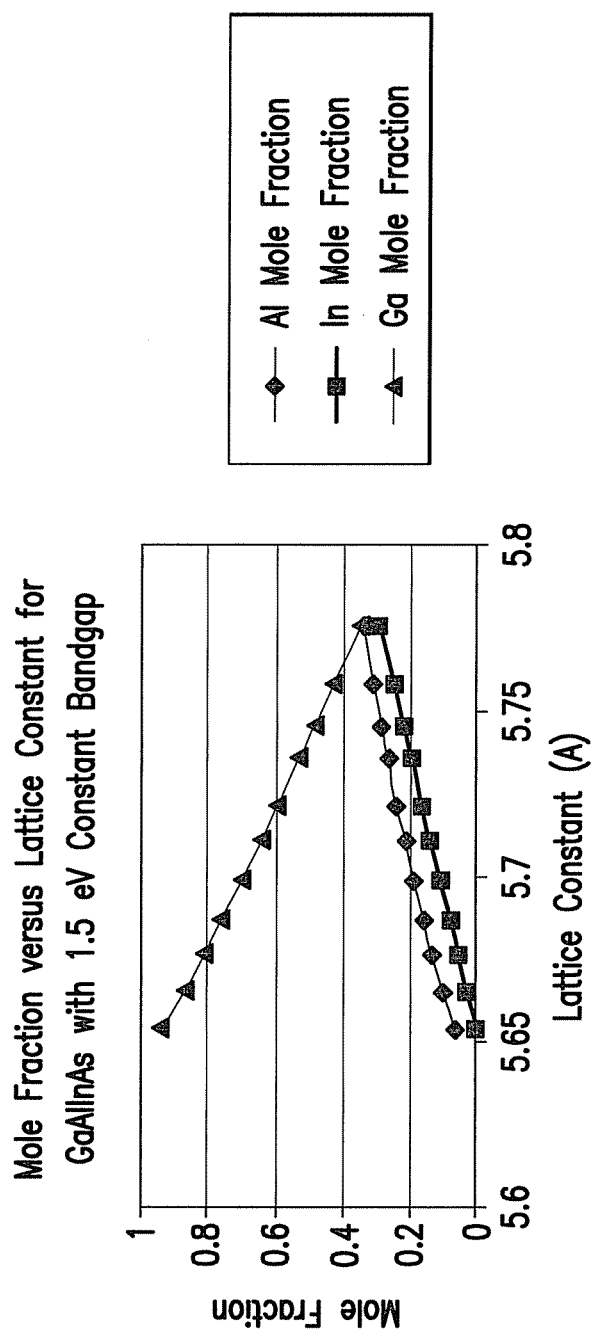
FIG. 24 is a graph representing the Al, Ga and In mole fractions versus the Al to In mole fraction in a AlGaInAs material system that is necessary to achieve a constant 1.5 eV band gap.

FIG. 24 is a graph representing the Al, Ga and In mole fractions versus the Al to In mole fraction in a AlGaInAs material system that is necessary to achieve a constant 1.5 eV band gap.

It will be understood that each of the elements described above, or two or more together, also may find a useful application in other types of constructions differing from the types of constructions described above.

Although the preferred embodiment of the present invention utilizes a vertical stack of three subcells, the present invention can apply to stacks with fewer or greater number of subcells, i.e. two junction cells, four junction cells, five junction cells, etc. as more particularly described in U.S. patent application Pub. No. 2010/0116327 A1 (Cornfeld). In the case of four or more junction cells, the use of more than one metamorphic grading interlayer may also be utilized, as more particularly described in U.S. patent application Pub. No. 2010/0122724 A1 (Cornfeld et al.).

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is fanned between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Pub. No. 2009/0078310 A1 (Stan et al.), the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness. Some such configurations are more particularly described in copending U.S. patent application Pub. No. 2009/0072438 A1 (Cornfeld).

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, MN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. A method for manufacturing a solar cell using a process for selectively freeing an epitaxial layer from a single crystal substrate upon which it was grown, comprising:
 providing a first substrate of gallium arsenide;
 depositing a separation layer on said first substrate;
 depositing on the separation layer a sequence of epitaxial layers of semiconductor material forming a solar cell including: forming over the separation layer an upper first solar subcell having a first band gap and including a semiconductor contact layer; forming over said first solar subcell a middle second solar subcell having a second band gap smaller than said first band gap; forming a graded interlayer over said second solar subcell; and forming over said graded interlayer a lower third solar subcell having a fourth band gap smaller than said second band gap such that said third subcell is lattice mismatched with respect to said second subcell;
 mounting the first substrate and the sequence of epitaxial layers of semiconductor material on a flexible film;
 mechanically holding said first substrate against a bottom support of an etching apparatus;
 attaching a connecting link element that connects at least two opposed points on the periphery of the flexible film to an upper portion of the etching apparatus;

introducing said solar cell having said flexible film bonded thereon into an etchant environment in said etching apparatus;

etching said separation layer while applying mechanical tension to said connecting link element so as to remove said flexible film with said epitaxial layers from said first substrate;

attaching the flexible film directly to a surrogate substrate by an electrostatic technique;

depositing a contact metal layer over the semiconductor contact layer;

lithographically processing the contact metal layer to form grid lines;

attaching a cover glass over the grid lines; and removing the surrogate substrate.

2. A method as defined in claim 1, wherein the etchant environment is a liquid solution.

3. A method as defined in claim 1, wherein the etchant environment is an atmosphere containing an etchant aerosol.

4. A method as defined in claim 1, wherein the surrogate substrate is composed of GaAs, Ge, or Si.

5. A method as defined in claim 1, wherein the etchant is hydrofluoric acid.

6. A method as defined in claim 1, wherein the separation layer has a thickness of approximately 50 Angstroms.

7. A method as defined in claim 1, wherein the electrostatic technique utilizes an electrostatic chuck.

8. A method as defined in claim 1, wherein the mechanical tension applied to said connecting link element allows said epitaxial layers and the surrogate substrate to curl upward, permitting the outdiffusion of reaction products of the etching process.

9. A method as defined in claim 1, wherein the upper subcell is composed of InGa(Al)P.

10. A method as defined in claim 1, wherein the middle subcell is composed of an GaAs, GaInP, GaInAs, GaAsSb, or GaInAsN emitter region and a GaAs, GaInAs, GaAsSb, or GaInAsN base region.

11. A method as defined in claim 1, wherein the lower solar subcell is composed of an InGaAs base and emitter layer, or a InGaAs base layer and a InGaP emitter layer.

12. A method as defined in claim 1, wherein the graded interlayer is compositionally graded to lattice match the middle subcell on one side and the lower subcell on the other side, and is composed of $(In_xGa_{1-x})_yAl_{1-y}As$ with x and y selected such that the band gap of the interlayer remains constant throughout its thickness and greater than said second band gap.

13. A method as defined in claim 12, wherein the graded interlayer has approximately a 1.5 eV band gap throughout its thickness.

14. A method as defined in claim 1, wherein the graded interlayer is composed of any of the As, N, Sb based III-V compound semiconductors subject to the constraints of having the in-plane lattice parameter greater or equal to that of the second solar cell and less than or equal to that of the third solar cell, and having a band gap energy greater than that of the second solar cell.

15. A method for manufacturing a solar cell using a process for selectively freeing an epitaxial layer from a single crystal substrate upon which it was grown, comprising:

providing a first substrate of gallium arsenide;

depositing a separation layer having a thickness of approximately 50 Angstroms on said first substrate;

depositing on the separation layer a sequence of epitaxial layers of semiconductor material forming a solar cell including:

forming over the separation layer an upper first solar subcell composed of InGa(Al)P and having a first band gap and including a semiconductor contact layer;

forming over said first solar subcell a middle second solar subcell composed of an GaAs, GaInP, GaInAs, GaAsSb, or GaInAsN emitter region and a GaAs, GaInAs, GaAsSb, or GaInAsN base region and having a second band gap smaller than said first band gap;

forming a graded interlayer over said second solar subcell, wherein the graded interlayer is compositionally graded to lattice match the middle subcell on one side and the lower subcell on the other side, and is composed of $(In_xGa_{1-x})_yAl_{1-y}As$ with x and y selected such that the band gap of the interlayer remains constant at approximately 1.5 eV throughout its thickness and greater than said second band gap; and forming over said graded interlayer a lower third solar subcell composed of an InGaAs base and emitter layer, or a InGaAs base layer and a InGaP emitter layer, and having a fourth band gap smaller than said second band gap such that said third subcell is lattice mismatched with respect to said second subcell;

mounting the first substrate and the sequence of epitaxial layers of semiconductor material on a flexible film;

mechanically holding said first substrate against a bottom support of an etching apparatus;

attaching a connecting link element that connects at least two opposed points on the periphery of the flexible film to an upper portion of the etching apparatus;

introducing said solar cell having said flexible film bonded thereon into an etchant environment with a liquid solution of hydrofluoric acid in said etching apparatus;

etching said separation layer while applying mechanical tension to said connecting link element so as to remove said flexible film with said epitaxial layers from said first substrate, wherein the mechanical tension applied to said connecting link element allows said epitaxial layers and the surrogate substrate to curl upward, permitting the outdiffusion of reaction products of the etching process;

attaching the flexible film directly to a surrogate substrate composed of GaAs, Ge, or Si by an electrostatic technique utilizing an electrostatic chuck;

depositing a contact metal layer over the semiconductor contact layer;

lithographically processing the contact metal layer to form grid lines;

attaching a cover glass over the grid lines; and removing the surrogate substrate.

16. A method as defined in claim 15, wherein the etchant environment contains an etchant aerosol of the liquid hydrofluoric acid solution.

17. A method for manufacturing a solar cell using a process for selectively freeing an epitaxial layer from a semiconductor substrate upon which it was grown, comprising:

providing a first semiconductor substrate;

depositing a separation layer on said first substrate;

depositing a sequence of epitaxial layers of semiconductor material on the separation layer to form a multi junction solar cell;

mounting the first substrate and the sequence of epitaxial layers of semiconductor material on a flexible film;

mechanically holding said first substrate against a bottom support of an etching apparatus;

attaching a connecting link element that connects at least two opposed points on the periphery of the flexible film to an upper portion of the etching apparatus;

introducing said solar cell having said flexible film bonded thereon into an etchant environment in said etching apparatus;

etching said separation layer while applying mechanical tension to said connecting link element so as to remove said flexible film with said epitaxial layers from said first substrate;

attaching the flexible film directly to a surrogate substrate by an electrostatic technique; and removing the surrogate substrate.

18. A method as defined in claim 17, wherein the etchant is hydrofluoric acid.

19. A method as defined in claim 17, wherein the electrostatic technique utilizes an electrostatic chuck.

20. A method as defined in claim 17, wherein the mechanical tension applied to said connecting link element allows said epitaxial layers and the surrogate substrate to curl upward, permitting the outdiffusion of reaction products of the etching process.

* * * * *